United States Patent
Krabe

(10) Patent No.: US 9,541,717 B2
(45) Date of Patent: Jan. 10, 2017

(54) OPTOELECTRONIC ASSEMBLY INCORPORATING AN OPTICAL FIBER ALIGNMENT STRUCTURE

(71) Applicant: Avago Technologies General IP (Singapore) Pte. Ltd, Singapore (SG)

(72) Inventor: Detlef B Krabe, Munich (DE)

(73) Assignee: Avago Technologies General IP (Singapore) Pta. Ltd., Singapore (SG)

( * ) Notice: Subject to any disclaimer, the term of this patent is extended or adjusted under 35 U.S.C. 154(b) by 0 days.

(21) Appl. No.: 14/610,713

(22) Filed: Jan. 30, 2015

(65) Prior Publication Data

US 2016/0223765 A1   Aug. 4, 2016

(51) Int. Cl.
  G02B 6/12   (2006.01)
  G02B 6/42   (2006.01)
  G02B 6/30   (2006.01)
  H01L 33/00  (2010.01)

(52) U.S. Cl.
  CPC ............... *G02B 6/4231* (2013.01); *G02B 6/30* (2013.01); *G02B 6/426* (2013.01); *G02B 6/4281* (2013.01); *H01L 33/005* (2013.01)

(58) Field of Classification Search
  None
  See application file for complete search history.

(56) References Cited

U.S. PATENT DOCUMENTS

| | | | |
|---|---|---|---|
| 4,711,997 A | 12/1987 | Miller | |
| 4,713,841 A | 12/1987 | Porter et al. | |
| 5,532,512 A | 7/1996 | Fillion et al. | |
| 6,328,482 B1 | 12/2001 | Jian | |
| 6,595,698 B2 | 7/2003 | Gutierrez et al. | |
| 7,048,450 B2 | 5/2006 | Beer et al. | |
| 7,170,049 B2 | 1/2007 | Iwanczyk et al. | |
| 7,486,847 B1 | 2/2009 | Dellmann | |
| 7,536,066 B2 | 5/2009 | Kato et al. | |
| 7,539,366 B1 | 5/2009 | Baks et al. | |
| 7,833,480 B2 | 11/2010 | Blazewicz et al. | |
| 7,863,088 B2 | 1/2011 | Brunnbauer et al. | |

(Continued)

FOREIGN PATENT DOCUMENTS

WO   WO 0002247 A1   1/2000

OTHER PUBLICATIONS

Bottoms et al. "A description of what will specifically be needed to support continuation of the rapid pace of progress achieved by the electronics industry." Future Fab International, ITRS http://www.future-fab.com/documents.asp?d_ID=4912.

(Continued)

*Primary Examiner* — Sung Pak

(57) ABSTRACT

Device assemblies that include one or more optoelectronic devices incorporating one or more polymer-based fiber alignment structures are described. In accordance with some embodiments, the device assemblies can be fabricated using Embedded Wafer-Level Packaging (eWLP) methods. Each of the polymer-based fiber alignment structures operates as a stationary guiding structure for automatically guiding an optical fiber into optical alignment with a light propagating portion of the optoelectronic device when the optical fiber is inserted into a hollowed central portion of the polymer-based fiber alignment structure, the hollowed central portion having sloping sides.

10 Claims, 15 Drawing Sheets

(56) References Cited

U.S. PATENT DOCUMENTS

| | | | |
|---|---|---|---|
| 8,064,739 B2 | 11/2011 | Binkert et al. | |
| 8,352,009 B2 | 1/2013 | Hoarau et al. | |
| 8,642,385 B2 | 2/2014 | Xue et al. | |
| 8,642,397 B1 | 2/2014 | Gong et al. | |
| 8,742,370 B2 | 6/2014 | Tkachuk | |
| 9,142,746 B2 | 9/2015 | Weigert | |
| 2002/0095077 A1 | 7/2002 | Swedlow et al. | |
| 2004/0037514 A1* | 2/2004 | Marion | G02B 6/4202 385/90 |
| 2004/0057648 A1 | 3/2004 | Yunus | |
| 2004/0069997 A1 | 4/2004 | Dair et al. | |
| 2004/0156597 A1* | 8/2004 | Kaneko | G02B 6/4212 385/88 |
| 2004/0217366 A1 | 11/2004 | Gale | |
| 2004/0223704 A1* | 11/2004 | Fujii | G02B 6/4228 385/88 |
| 2004/0259282 A1 | 12/2004 | Oohata | |
| 2005/0100264 A1 | 5/2005 | Kim et al. | |
| 2005/0226565 A1* | 10/2005 | Kautio | G02B 6/423 385/52 |
| 2006/0045431 A1* | 3/2006 | Boisvert | G02B 6/423 385/88 |
| 2008/0122122 A1 | 5/2008 | Wong et al. | |
| 2008/0186702 A1 | 8/2008 | Camras et al. | |
| 2009/0166857 A1 | 7/2009 | Lee | |
| 2010/0061106 A1 | 3/2010 | Shyu et al. | |
| 2010/0316184 A1 | 12/2010 | Iwanczyk et al. | |
| 2011/0024916 A1 | 2/2011 | Marimuthu et al. | |
| 2011/0042798 A1 | 2/2011 | Pagaila et al. | |
| 2011/0095426 A1 | 4/2011 | Chang | |
| 2011/0193241 A1 | 8/2011 | Yen et al. | |
| 2011/0194265 A1 | 8/2011 | Su et al. | |
| 2012/0038044 A1 | 2/2012 | Chang et al. | |
| 2012/0220082 A1 | 8/2012 | Ng et al. | |
| 2013/0001795 A1 | 1/2013 | Lim et al. | |
| 2013/0075924 A1 | 3/2013 | Lin et al. | |
| 2013/0237774 A1 | 9/2013 | Schentag et al. | |
| 2013/0241077 A1 | 9/2013 | Fuergut et al. | |
| 2013/0264684 A1 | 10/2013 | Yu et al. | |
| 2013/0266255 A1 | 10/2013 | Tan | |
| 2013/0320471 A1 | 12/2013 | Luan | |
| 2015/0003792 A1* | 1/2015 | Mathai | G02B 6/4285 385/89 |
| 2015/0118770 A1 | 4/2015 | Krabe et al. | |
| 2015/0262983 A1 | 9/2015 | Krabe | |

OTHER PUBLICATIONS

"Wafer Level Chip Scale Package (WLCSP)", Freescale Semiconductor Application Note, Aug. 2009, 16 pages.

"eWLB Embedded Wafer-Level Ball Grid Array," STATS chipPAC ltd. Singapore, Aug. 2011, 1-2 pages.

"Kitronik Ltd—5mm RGB LED Common Anode," Technology Data Sheet & Specifications, http://kitronik.co.uk, 3 pages.

"SiliconCore LED Display Products," www.silicon-core.com, SiliconCore Technology, Inc., Jan. 4, 2013, 53 pages.

"Blinkm Datasheet," blinkm.thingm.com, v20100810, Thingm Labs, 50 pages.

"Renesas to Commercialize FO-WLP Technology in MCU Product Line by 2011," I-Micronews, Oct. 20, 2010, 2 pages (retrieved from http://www.i-micronews.com/adbanced-packaging-news/1859-renesas-to-commercialize-fo-wlp-technology-in-mcu-product-line-by-2011.html).

Dr. William Henry, "MicroLEDs Enabling New Generation of Fluorescence Instruments," BioPhotonics, www.photonics.com, 2014, 5 pages.

Artur Dybko, "Fiber Optic Chemical Sensors," Chemical Sensors Research Group, 2005, 9 pages, http://csrg.ch.pw.edu.pl/tutorials/fiber.

Bottoms et al., "An Overview of the Innovations, Emerging Technologies and Difficult Challenges Regarding the Assembly & Packaging Chapter of the ITRS," Assembly & Packaging, Jan. 15, 2009, 4 pages, Future Fab International Issue 28, Future Fab International, http://www.future-fab.com.

Garrou, P. "IFTLE 29 IEEE 3D IC Test Workshop Part 2." Solid State Technnology [online]. Dec. 22, 2010. [retrieved on Jun. 27, 2013]. Retrieved from the Internet: <URL: http://www.electroiq.com/blogs/insights_from_leading_edge/2010.html>.

Souriau, J., et al. "Wafer Level Processing of 3D System in Package for RF and Data Applications." IEEE 2005 Electronic Components and Technology Conference. pp. 356-361.

Do-Won Kim et al.; High-Efficiency and Stable Optical Transmitter using VCSEL-direct-bonded Connector for Optical Interconnection; Nov. 13, 2007.

Mario Paniccia; The Silicon Solution; Oct. 1, 2005.

Office Action mailed Mar. 20, 2015 for U.S. Appl. No. 14/064,406.

Office Action mailed Aug. 10, 2015 for U.S Appl. No. 14/064,406.

* cited by examiner

OPTOELECTRONIC ASSEMBLY INCORPORATING AN OPTICAL FIBER ALIGNMENT STRUCTURE

FIELD OF THE INVENTION

The invention relates to optoelectronic devices, and more particularly, to optoelectronic devices that provide optical fiber connectivity.

BACKGROUND

Optoelectronic devices and modules are known in the industry. For example, optical transmitter and receiver modules are used in many types of optical communications systems. As is known, an optical transmitter can convert modulated electrical signals into optical signals for transmission over an optical fiber that is coupled to the optical transmitter. An optical receiver that is coupled to the other end of the optical fiber can receive the optical signals transmitted over the optical fiber and recover information by demodulating the optical signals.

As is also known, coupling the optical fiber to devices such as the optical transmitter or the optical receiver involves the use of various types of connector assemblies and fixtures. However, the use of some conventional connector assemblies and fixtures is not only complicated and time-consuming but can also lead to an undesirable level of insertion loss in the optical signal. The insertion loss can arise as a result of a number of factors, such as, for example, poor alignment between the optical fiber and the optical transmitter (or the optical receiver).

It is therefore desirable to provide mechanisms and structures that allow for relatively easy coupling of an optical fiber to an optical transmitter or optical receiver while also minimizing insertion loss when doing so.

SUMMARY

Device assemblies that include one or more optoelectronic devices incorporating one or more polymer-based fiber alignment structures are disclosed. In accordance with a first example embodiment, an assembly includes an optoelectronic device having a light propagating portion; a board having a pre-alignment hole; and a polymer-based fiber alignment structure located between the board and the optoelectronic device. The pre-alignment hole in the board extends through the board from a top major surface to a bottom major surface. The board is arranged with respect to the optoelectronic device such that the pre-alignment hole is substantially aligned with the light propagating portion of the optoelectronic device. The polymer-based fiber alignment structure includes a tapered portion that is operative as a stationary guiding structure for automatically guiding an optical fiber into optical alignment with the light propagating portion of the optoelectronic device when the optical fiber is inserted via the pre-alignment hole of the board into the tapered portion of the polymer-based fiber alignment structure.

In accordance with a second example embodiment, a method of fabricating an eWLP package includes providing one or both of a dielectric layer and a metal layer on a top portion of at least one optoelectronic device that is a part of a wafer assembly; depositing a layer of a polymer-based material on a top surface of the dielectric layer and/or the metal layer; and fabricating at least one polymer-based fiber alignment structure by removing a portion of the polymer-based material. The polymer-based fiber alignment structure is operative as a stationary guiding structure for automatically guiding an optical fiber into optical alignment with a light propagating portion of the optoelectronic device when the optical fiber is inserted into a hollowed central portion of the polymer-based fiber alignment structure, the hollowed central portion having sloping sides.

In accordance with a third example embodiment, an assembly includes an eWLP package comprising an optoelectronic device encapsulated within a hard molded compound. An SU-8 polymer-based fiber alignment structure is attached to the optoelectronic device. The SU-8 polymer-based fiber alignment structure has either a mesa-shape or a vertically elongated shape and includes a hollowed central portion having sloping sides. The sloping sides operate as a stationary guiding structure for automatically guiding an optical fiber into optical alignment with a light propagating portion of the optoelectronic device when the optical fiber is inserted into the SU-8 polymer-based fiber alignment structure.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale, emphasis instead being placed upon illustrating the principles of the invention. The drawings should not be interpreted as limiting the scope of the invention to the example embodiments shown herein.

WRITTEN DESCRIPTION

Figure 1A:
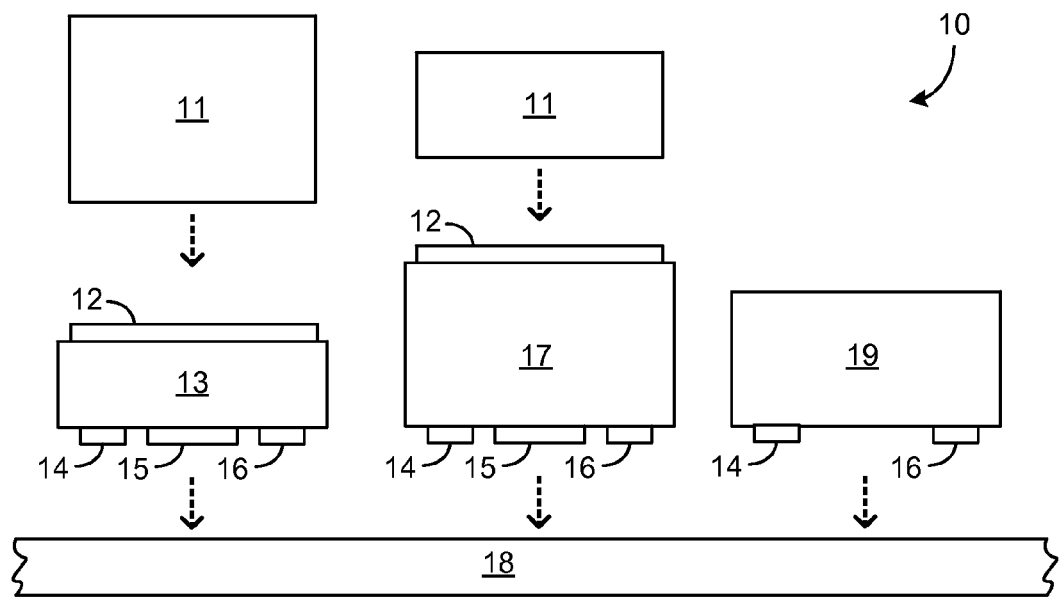
FIG. 1A shows a cross-sectional side-view of a set of components that constitute one portion of a wafer assembly in accordance with the disclosure.

Generally, in accordance with illustrative embodiments described herein, methods, devices, packages and assemblies are provided that pertain to an optoelectronic device incorporating a polymer-based fiber alignment structure. The polymer-based fiber alignment structure can be used as a stationary guiding structure for automatically aligning an optical fiber with a light propagating portion of the optoelectronic device when an optical fiber is inserted into a central cavity portion of the polymer-based fiber alignment structure. During the process of insertion, the sloping sides of the central cavity portion automatically guide the optical fiber such that a longitudinal axis of the optical fiber becomes aligned with a light propagating axis of the optoelectronic device.

As is known, optoelectronic devices can be fabricated and packaged using various technologies. One among these various technologies is referred to as surface mount technology (SMT). SMT has been the predominant technology used to make small and flat optoelectronic packages and assemblies over the past many years. In this technology, semiconductor chips (or dies) are mounted on to a lead frame or PCB, followed by wire bonding electrical contacts of the chips to a lead frame and/or to the PCB. The assembly is then encapsulated by using over-molding, pre-molding and/or casting techniques. With ongoing demands in the industry for further size reductions, further increases in functionality, and further improvements in operational accuracy, the standard SMT assembly process is reaching its limits. The industry is therefore moving towards the use of newer technologies such as for example, extended wafer-level packaging (eWLP).

eWLP technology is a semiconductor device manufacturing and packaging technology in which a number of semiconductor dies or chips are co-formed upon a single "artificial wafer" and then transformed into individual devices by dicing or singulating the wafer. Various types of passive electrical components and optical elements may also be co-located on the wafer prior to singulating the artificial wafer. eWLP technology also allows electrical and optical interfaces to be formed on the front side and/or on the back side of the eWLP wafer. This allows a wide variety of very thin optoelectronic devices and assemblies to be manufactured in high volume with high yield and high throughput.

In view of such advantages provided by eWLP technology, some example embodiments that are described herein are directed to fabricating eWLP packages incorporating one or more optoelectronic devices each having a polymer-based fiber alignment structure. The dimensions of the polymer-based fiber alignment structure can be selected in accordance with the dimensions of the optoelectronic device embedded in an eWLP package, and/or the diameter of an optical fiber that is to be coupled to the optoelectronic device.

It should be understood however, that in other embodiments, the polymer-based fiber alignment structure can not only be incorporated into various packages other than eWLP packages, but can also be fabricated using materials other than a polymer. For example, persons of ordinary skill in the art can understand that a fiber alignment structure in accordance with the disclosure can be incorporated into a traditional hybrid micro-circuit (HMC) package. Furthermore, the fiber alignment structure can be fabricated using various types of materials other than a polymer, as long as these materials are suitable for fabricating in particular, the central cavity portion having sloping sides as described herein. A few examples of such materials include a rubber based compound, a silicone based compound, a dielectric, a semiconductor material, and a metal.

It will be pertinent to point out at this time that some portions of the subject matter described herein have been disclosed by the same first named inventor in at least two other co-pending applications that are directed to other devices and methods. Thus, U.S. application Ser. No. 14/330,022, filed Jul. 14, 2014, entitled "METHODS FOR PERFORMING EMBEDDED WAFER-LEVEL PACKAGING (eWLP) AND eWLP DEVICES MADE BY THE METHODS," which is currently pending, is incorporated herein by reference in its entirety. U.S. application Ser. No. 14/064,406, filed Oct. 28, 2013, entitled "WAFER-LEVEL PACKAGES HAVING VOIDS FOR OPTO-ELECTRONIC DEVICES," which is also currently pending is incorporated herein by reference in its entirety as well.

Attention is now drawn to FIG. 1A, which shows a cross-sectional side-view of one set of components that constitute a portion of a wafer assembly 10 in accordance with the disclosure. Not shown is the rest of the wafer assembly 10 that can include many more similar sets of components to execute what is known in the industry as batch manufacturing. Each similar set of components is selected to be part of an independent device, such as for example, an integrated circuit (IC). Thus, a number of identical ICs each containing similar components can be simultaneously manufactured using a single wafer assembly.

In the example embodiment shown in FIG. 1A, the set of components includes an optoelectronic emitter device 13, an optoelectronic receiver device 17, and an additional device 19. These components collectively constitute one optoelectronic transceiver device among several similar optoelectronic transceiver devices fabricated from the wafer assembly 10.

Thus, it should be understood that FIG. 1A shows only the portion of the wafer assembly 10 (representing one example optoelectronic transceiver device) on which the optoelectronic emitter device 13, the optoelectronic receiver device 17, and one or more additional devices (pictorially represented by the additional device 19) are attached to an adhesive tape 18.

The optoelectronic emitter device 13 can be any of a wide variety of light emitting devices, such as for example various types of laser devices and various types of light emitting diodes (LEDs). The optoelectronic receiver device 17 can be any of a wide variety of photonic detectors, such as for example, a photodetector, a light sensor, and a charge coupled device (CCD). A few examples of the additional device 19 include a block of bulk material, a passive device (such as a resistor, an inductor, or a capacitor), or an integrated circuit (IC).

In this example fabrication procedure, a major surface of each of the optoelectronic emitter device 13 and the optoelectronic receiver device 17 includes a metallization layer 12 upon which is mounted a backside interconnection element 11. The mounting of the backside interconnection element 11 upon each of the optoelectronic emitter device 13 and the optoelectronic receiver device 17 can be carried out using a pick-and-place machine as is known in the art. The various steps of the mounting operations are indicated in FIG. 1A in the form of dashed line arrows. It may be pertinent to point out once again that the drawings are not necessarily drawn to scale. Consequently, the individual size of each of the various elements shown in FIG. 1A can vary from one embodiment to another. For example, in FIG. 1A, the backside interconnection element 11 mounted on the optoelectronic emitter device 13 is shown to be bigger than the backside interconnection element 11 mounted on the optoelectronic receiver device 17. In other implementations, the backside interconnection element 11 mounted on the optoelectronic emitter device 13 can be identical in size to the backside interconnection element 11 mounted on the optoelectronic receiver device 17.

An opposing major surface of each of the optoelectronic emitter device 13 and the optoelectronic receiver device 17 includes a light propagating portion 15 (such as a lens, a transparent window, or a semi-transparent window) and one or more electrical contacts (such as a first electrical contact 14 and a second electrical contact 16). The light propagating portion 15 of the optoelectronic emitter device 13 provides for emission of light out of the optoelectronic emitter device 13, while the light propagating portion 15 of the optoelectronic receiver device 17 provides for propagating of received light into the optoelectronic receiver device 17.

The backside interconnection element 11 may be fabricated from any type of electrically-conductive or semiconductor material. In one example implementation, the backside interconnection element 11 is fabricated from a semiconductor material such as silicon that has been doped with an n-type material (phosphorus, for example) in order to provide a higher level of electrical conductivity. Silicon provides certain advantages such as compatibility with wafer-level microelectronic chip fabrication processes that can be employed in accordance with one or more embodiments of the invention. Consequently, the backside interconnection element 11 may be advantageously formed of n-doped silicon blocks. However it will be understood that the invention is not limited to using silicon blocks for this purpose. In various embodiments, the backside interconnection element 11 may be formed of a metal or a metal alloy in the form of a solder bump, for example.

In this example fabrication procedure, each of the backside interconnection elements 11 is diced from an n-doped silicon wafer prior and a lower major surface of the backside interconnection element 11 is dipped in an adhesive material. The step of dipping the backside interconnection element 11 in the adhesive material typically occurs prior to the pick-and-place process. Each of the backside interconnection elements 11 is then placed on the respective metallization layer 12 by a pick-and-place machine (not shown). The process of curing the adhesive material may be accomplished in different ways, such as by using heat and/or by using ultraviolet light.

The pick-and-place procedure is further used to place each of the optoelectronic emitter device 13 and the optoelectronic receiver device 17 (with a respective backside interconnection element 11 attached), as well as the additional device 19 on the adhesive tape 18.

Figure 1B:
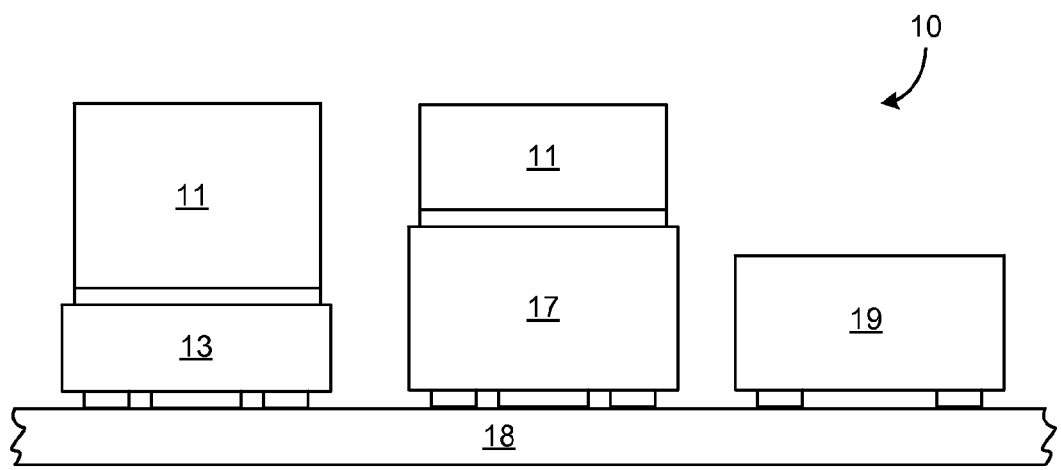
FIG. 1B shows a cross-sectional side-view of the portion of the wafer assembly after the set of components shown in FIG. 1A is affixed to an adhesive tape.

FIG. 1B shows a cross-sectional side-view of the wafer assembly 10 after the various devices shown in FIG. 1A are affixed to the adhesive tape 18. The adhesive tape 18 not only holds the optoelectronic emitter device 13 and the optoelectronic receiver device 17 in place but also the additional device 19, thereby facilitating the next step of the fabrication procedure. It will be understood that the optoelectronic emitter device 13, the optoelectronic receiver device 17, and the additional device 19 shown in the various figures constitute merely one set of devices that are used for purposes of description. In other embodiments, various other sets of devices can be used, such as for example, two or more of the same type of devices. Thus, for example, in another embodiment, a unique set of five optoelectronic emitter devices 13 may be affixed to the adhesive tape 18. In yet another embodiment, a unique set of two optoelectronic receiver devices 17 may be affixed to the adhesive tape 18. It will be understood that in general, a large number of similar sets of devices will be mounted on the adhesive tape 18 in order to fabricate a batch of identical assemblies.

Figure 1C:
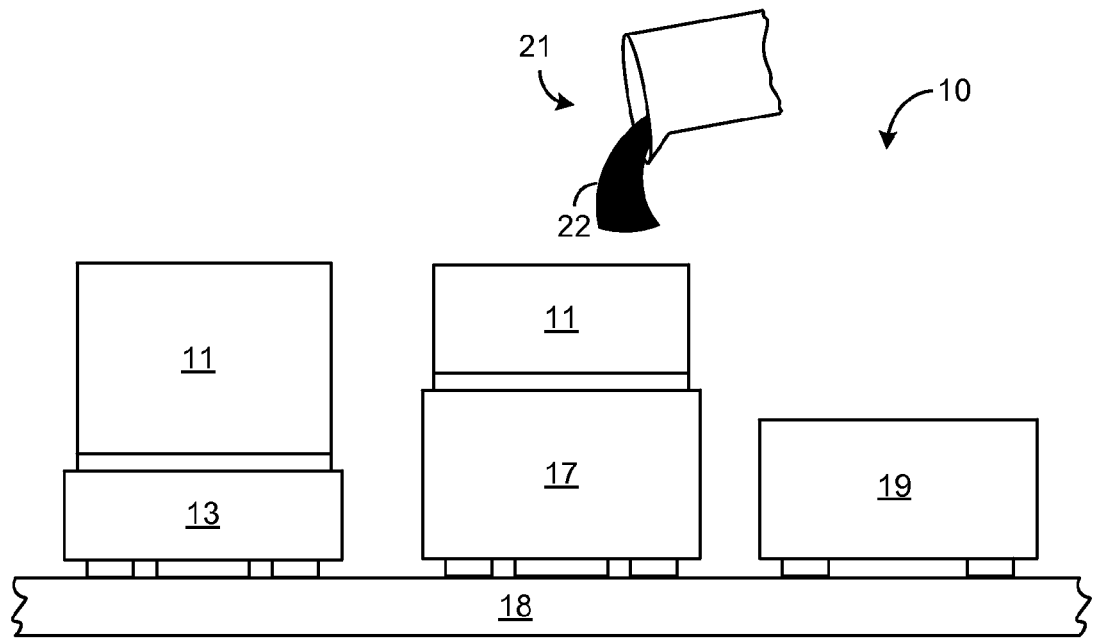
FIG. 1C shows a cross-sectional side-view of the portion of the wafer assembly during the process of pouring a mold compound over the set of components affixed to the adhesive tape.

FIG. 1C shows a cross-sectional side-view of the wafer assembly 10 during the process of pouring a mold compound 22 over the various components affixed to the adhesive tape 18. The mold compound 22 can be poured using an appropriate dispensing device 21 in a compression-mold process, for example. The mold compound 22 can then hardened by employing a curing procedure.

Figure 1D:
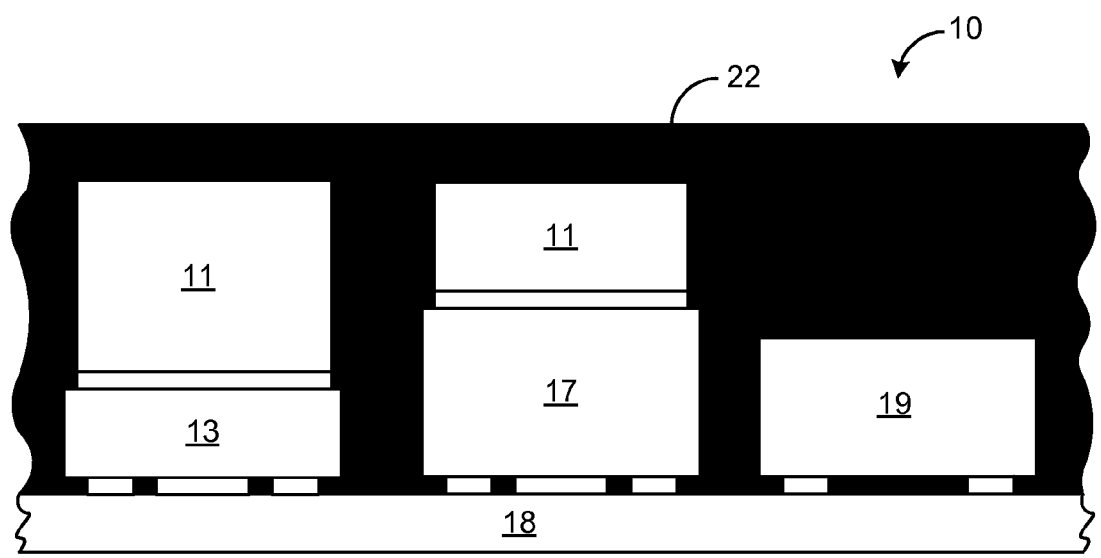
FIG. 1D shows a cross-sectional side-view of the portion of the wafer assembly after compression-molding and thermal curing to harden the mold compound.

FIG. 1D shows a cross-sectional side-view of the wafer assembly 10 after the mold compound 22 is hardened and the various components are embedded inside the mold compound 22. The adhesive tape 18 is retained in place.

Figure 1E:
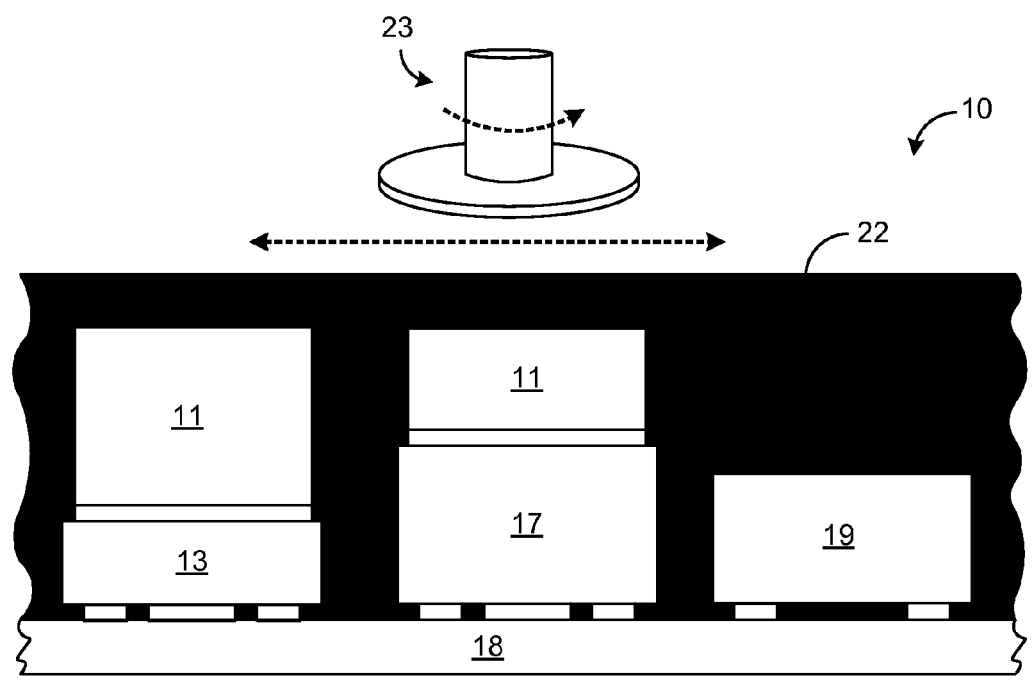
FIG. 1E shows a cross-sectional side-view of the portion of the wafer assembly during a grinding procedure to remove some of the mold compound.
Figure 1F:
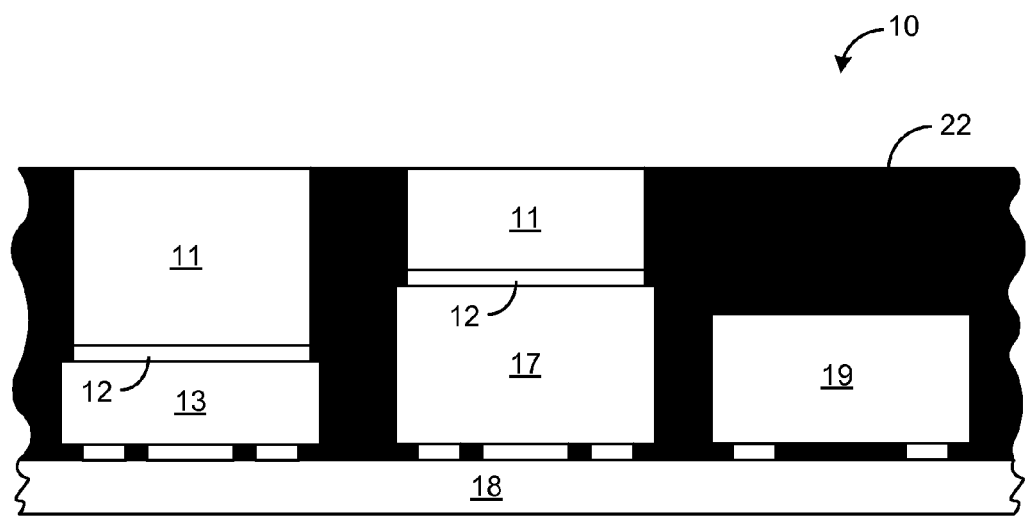
FIG. 1F shows the portion of the wafer assembly after executing the grinding procedure of FIG. 1E.

FIG. 1E shows a cross-sectional side-view of the wafer assembly 10 wherein a grinding procedure is used to remove a portion of the mold compound 22. Towards this end, a grinding device 23 (shown as a traversing rotary grinder solely for purposes of description) is used to remove a portion of the mold compound 22 to an extent whereby an upper major surface of each of the backside interconnection elements 11 is exposed (as shown in FIG. 1F). The backside interconnection elements 11 provide electrical interconnectivity from the upper exposed major surface of the wafer assembly 10 to the metallization layer 12, thereby eliminating the need to use traditional galvanic and/or electroplating processes for providing electrically-conductive contact areas on the top surface of the mold compound 22. Such traditional processes typically use copper or nickel as the electrically-conductive material, and a grinding process would produce copper or nickel particles that can contaminate the wafer assembly 10. By avoiding the use of such processes and materials, the back side electrical connections are made safely and economically at the eWLP wafer-level without risking contamination.

Figure 1G:
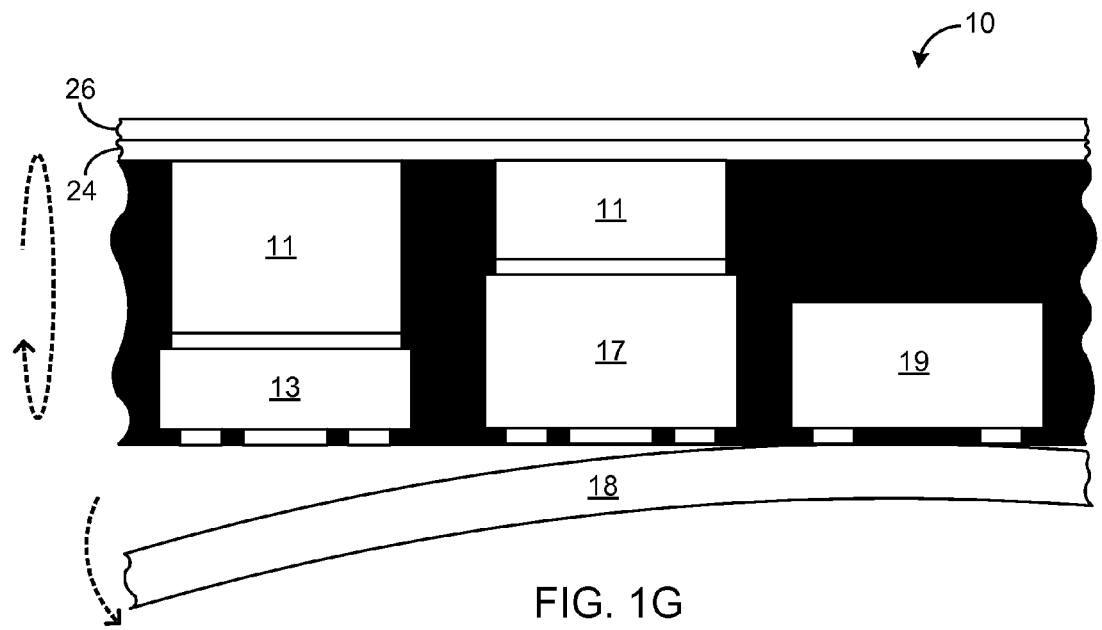
FIG. 1G shows a cross-sectional side-view of the portion of the wafer assembly with depositing of additional layers on the mold compound and removal of the adhesive tape.

FIG. 1G shows a cross-sectional side-view of the wafer assembly 10 wherein additional layers are deposited on top of the exposed upper major surface of each of the backside interconnection elements 11. Specifically, a metal layer 24 is first deposited directly on top of the exposed upper major surface of each of the backside interconnection elements 11. This is followed by depositing a dielectric material layer 26 on top of the metal layer 24. Also, the adhesive tape 18 is removed at this fabrication step.

Figure 1H:
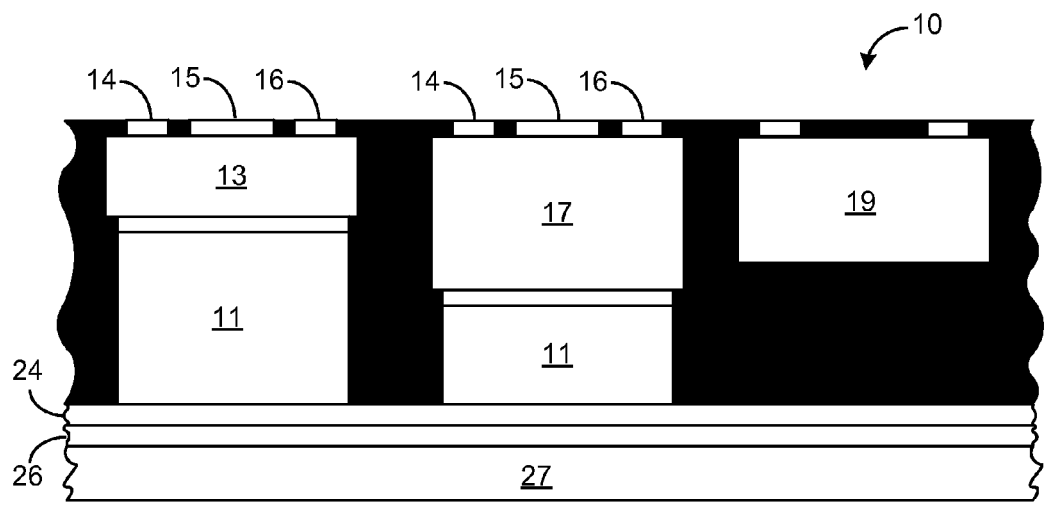
FIG. 1H shows a cross-sectional side-view of the portion of the wafer assembly after flipping of the wafer assembly and affixing to another adhesive tape.

FIG. 1H shows a cross-sectional side-view of the wafer assembly 10 after flipping of the wafer assembly 10 and affixing to another adhesive tape 27. At this stage of fabrication, the dielectric material layer 26 is in contact with the adhesive tape 27. The light propagating portion 15 of each of the optoelectronic emitter device 13 and the optoelectronic receiver device 17 (as well as the first electrical contact 14 and the second electrical contact 16) are located on the exposed upper major surface of the wafer assembly 10, thus becoming accessible for fabrication of additional structures as described below.

Figure 1I:
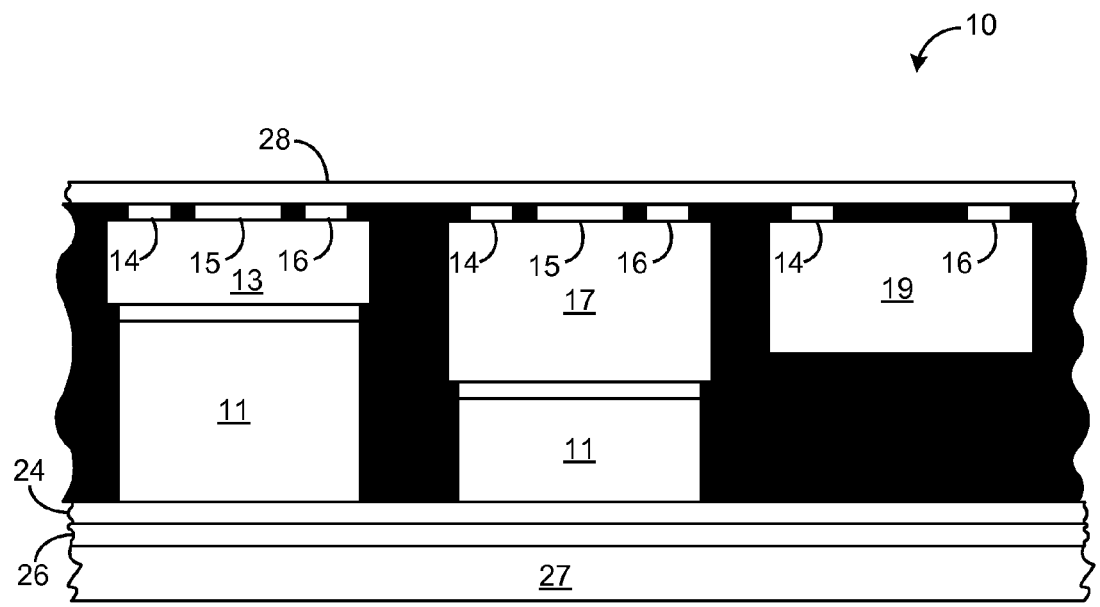
FIG. 1I shows a cross-sectional side-view of the portion of the wafer assembly with depositing of a metal layer on top of an exposed upper major surface.

FIG. 1I shows a cross-sectional side-view of the wafer assembly 10 wherein a metal layer 28 is deposited on top of the exposed upper major surface. Specifically, the metal layer 28 is deposited directly on top of the exposed upper major surface thereby covering each of the light propagating portions 15, the first electrical contact 14, and the second electrical contact 16. After depositing of the metal layer 28, a masking and etching procedure is used to remove certain portions of the metal layer 28. The procedure for using masks and etching is known in the art and will not be elaborated upon herein.

Figure 1J:
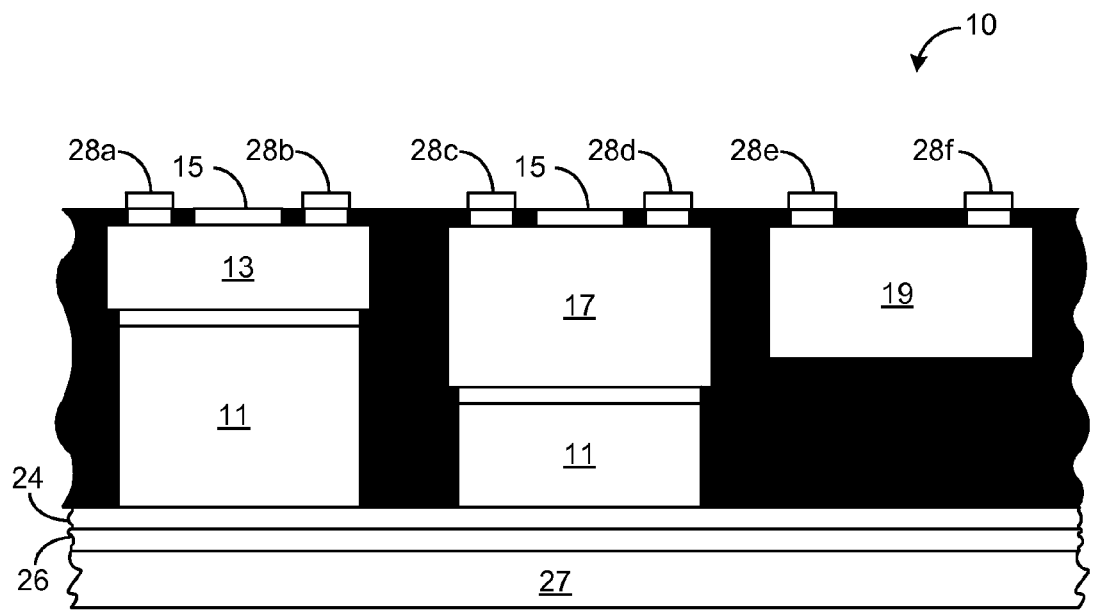
FIG. 1J shows a cross-sectional side-view of the portion of the wafer assembly after removal of certain portions of the metal layer shown in FIG. 1I.

FIG. 1J shows a cross-sectional side-view of the wafer assembly 10 after removal of certain portions of the metal layer 28 shown in FIG. H. Specifically, all parts of the metal layer 28 other than the portions deposited upon each of the first electrical contact 14 and the second electrical contact 16 have been removed. This procedure thereby provides a raised portion of metal 28a-f upon each of the first electrical contact 14 and the second electrical contact 16. These raised portions of metal 28a-f will be used for providing electrical connectivity via additional contact structures that are described below. Also described below is the fabrication of one or more fiber alignment structures that can be used for coupling light into and out of the exposed surfaces of each of the light propagating portions 15.

Figure 1K:
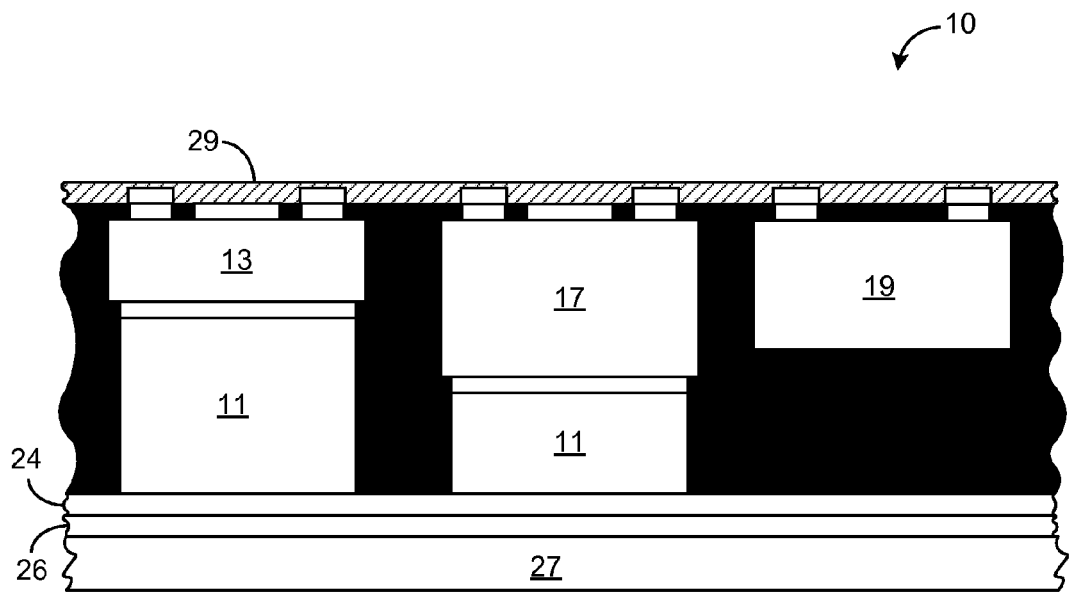
FIG. 1K shows a cross-sectional side-view of the portion of the wafer assembly after depositing of a dielectric layer on top of the remaining metal layer shown in FIG. 1J.

FIG. 1K shows a cross-sectional side-view of the wafer assembly 10 after depositing of a dielectric layer 29 on top of the remaining metal layer shown in FIG. 1J. The dielectric layer 29 covers each of the light propagating portions 15, the first electrical contact 14, and the second electrical contact 16.

Figure 1L:
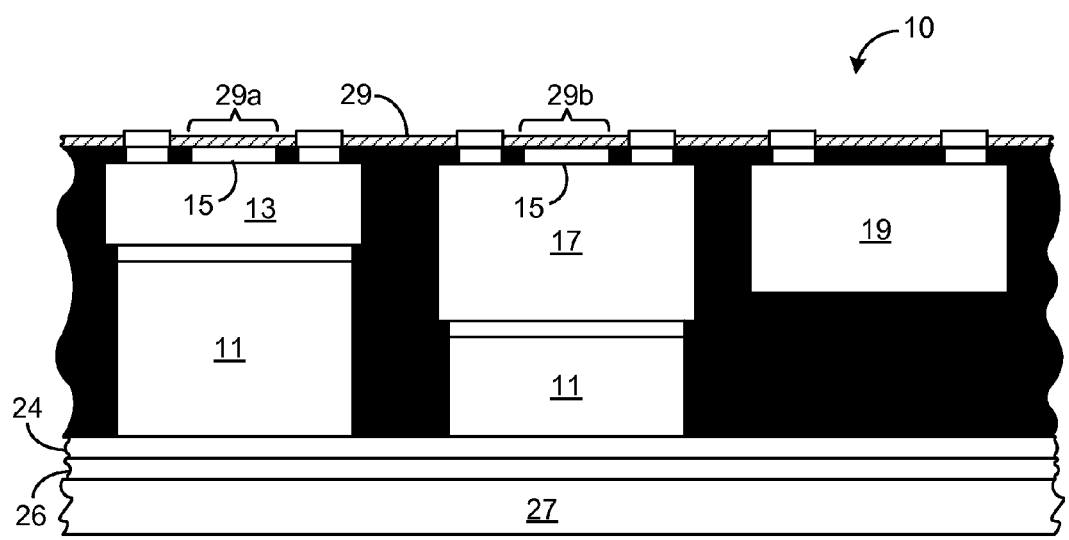
FIG. 1L shows a cross-sectional side-view of the portion of the wafer assembly after removal of some portions of the dielectric layer shown in FIG. 1K.

FIG. 1L shows a cross-sectional side-view of the wafer assembly 10 after removal of some portions of the dielectric layer 29 shown in FIG. 1K. The removal can be carried out using industry wide practice such as a photolithography procedure, and will not be described here in the interest of brevity. The dielectric layer 29 provides electrical insulation between the various first and second electrical contacts.

However, attention is drawn to portions 29a and 29b of the dielectric layer 29. The portions 29a and 29b are located on top of the light propagating portions 15 of the optoelectronic emitter device 13 and the optoelectronic receiver device 17 respectively. In a first example implementation, the portions 29a and 29b are fully removed during the photolithography procedure, thereby exposing the respective light propagating portion 15. However, in a second example implementation, the portions 29a and 29b are not removed during the photolithography procedure, thereby leaving both the light propagating portions 15 covered by the dielectric layer 29. In this second example implementation, the dielectric layer 29 can be a transparent material that does not adversely affect light propagation into and out of the light propagating portions 15.

In contrast to the steps described above with respect to the dielectric layer 29 and the photolithography procedure, in some embodiments, the steps of depositing the dielectric layer 29 layer (FIG. 1K) and the step of removing some of the portions of the dielectric layer 29 (FIG. 1L) may be entirely eliminated, thereby leaving exposed, the metal portions 28a-f shown in FIG. 1J, before proceeding to the additional steps described below. The further operations described below (FIGS. 1M through 1P) can be implemented on any of the various implementations described above (i.e., portions 29a and 29b fully removed, portions 29a and 29b not removed, or with no dielectric layer 29). However, solely as a matter of convenience, these further operations will be described below using the implementation wherein the portions 29a and 29b are not removed.

Figure 1M:
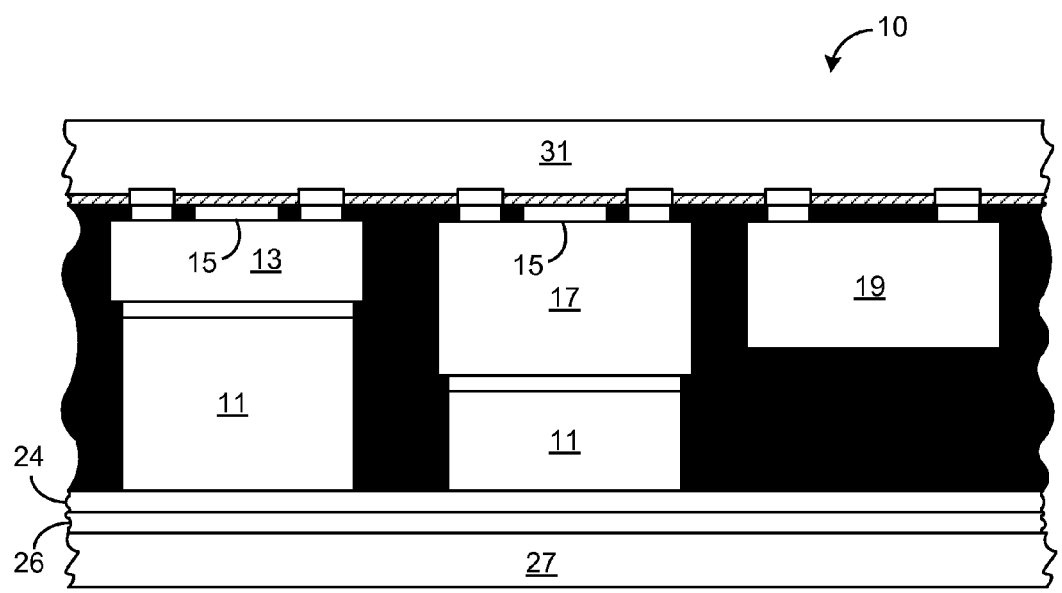
FIG. 1M shows a cross-sectional side-view of the portion of the wafer assembly after depositing of a polymer layer on top of the dielectric layer shown in FIG. 1L.

FIG. 1M shows a cross-sectional side-view of the wafer assembly 10 after depositing of a polymer layer 31 on top of the dielectric layer shown in FIG. 1L. One among various types of polymers that can be used for polymer layer 31 is a material that is referred to in the industry as SU-8. The SU-8 polymer is a negative, epoxy-type, near-UV photoresist based on an EPON SU-8 epoxy resin.

The thickness of the polymer layer 31 can be varied in accordance with various factors, such as, for example, the nature of the fabrication process, the size of the devices (the optoelectronic emitter device 13, the optoelectronic receiver device 17, and the additional device 19), the height of the assembly 10, and the dimensions of various optical fibers (not shown). However, a lower thickness threshold of about 0.2 microns can be used to ensure a minimum acceptable dimension of the polymer layer 31. In one example embodiment, an SU-8 polymer layer 31 is provided with a thickness of about 0.5 mm when the assembly 10 has a height of around 1 mm.

Figure 1N:
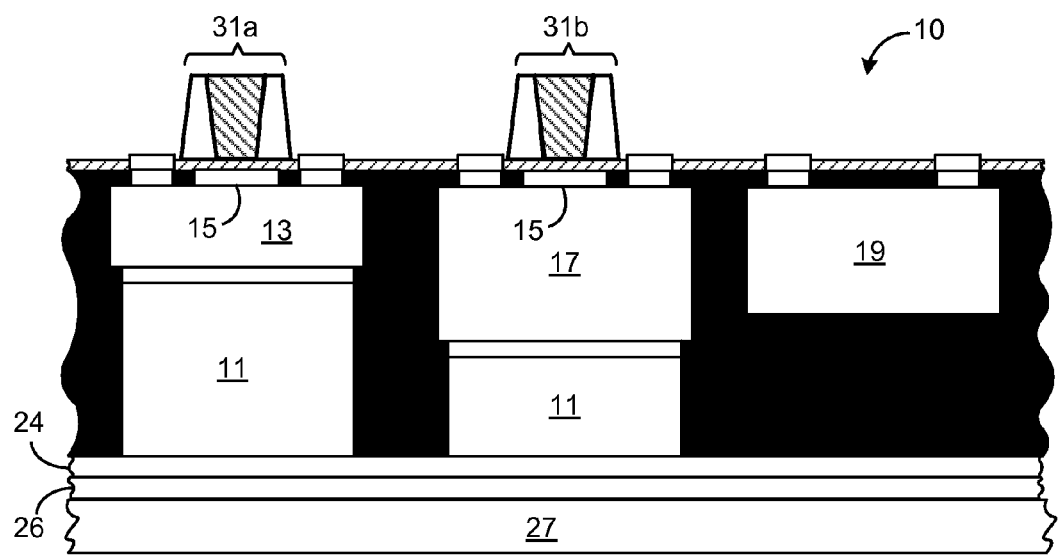
FIG. 1N shows a cross-sectional side-view of the portion of the wafer assembly after removal of portions of the polymer layer to form one or more polymer-based fiber alignment structures in accordance with a first example embodiment.

FIG. 1N shows a cross-sectional side-view of the wafer assembly 10 after removal of portions of the polymer layer 31 shown in FIG. 1M. In one example implementation, the removal of the portions of the polymer layer 31 is carried out by using a photolithographic procedure. Photolithographic procedures are known in the art and will not be elaborated upon herein. However, it should be understood that the photolithographic procedure involved in the removal of the portions of the polymer layer 31 is implemented with specific reference to the unique characteristics of a particular polymer (such as SU-8) that is used for the polymer layer 31. In other implementations, the removal of the portions of the polymer layer 31 can be carried out by using various other procedures, such as for example, by using a micro-machining procedure.

In this example embodiment, the removal of the portions of the polymer layer 31 results in a first polymer-based fiber alignment structure 31a that is located over the light propagating portion 15 of the optoelectronic emitter device 13 and a second polymer-based fiber alignment structure 31b that is located over the light propagating portion 15 of the optoelectronic receiver device 17. Additional details about the first polymer-based fiber alignment structure 31a and the second polymer-based fiber alignment structure 31b are provided below. However, prior to this, attention is drawn to FIG. 1P which shows a cross-sectional side-view of the wafer assembly 10 after placement of electrical contact elements 32a-f upon the raised metal portions 28a-f. (It may be pertinent to point out that FIG. 1O is intentionally omitted in order to avoid ambiguity in interpreting the label "1O").

Electrical contacts 32a and 32b are respectively placed upon the raised portion of metal 28a (located on the first electrical contact 14) and upon the raised portion of metal 28b (located on the second electrical contact 16) of the optoelectronic emitter device 13. Electrical contacts 32c and 32d are respectively placed upon the raised portion of metal 28c (located on the first electrical contact 14) and upon the raised portion of metal 28d (located on the second electrical contact 16) of the optoelectronic receiver device 17. Electrical contacts 32e and 32f are respectively placed upon the raised portion of metal 28e (located on the first electrical contact 14) and upon the raised portion of metal 28f (located on the additional device 19). Electrical contacts 32a-f can be used for coupling other elements to the optoelectronic emitter device 13, the optoelectronic emitter device 17, and/or the additional device 19, as will be described below in more detail. Dashed arrow 33 indicates a first optical axis for light that is transmitted out of the light propagating portion 15 of the optoelectronic emitter device 13. Dashed arrow 34 indicates a second optical axis for light that is transmitted by an optical fiber (not shown) into the light propagating portion 15 of the optoelectronic receiver device 17.

At this step of the fabrication procedure, the wafer assembly 10 can be viewed as constituting an artificial wafer that can be diced in order to produce a batch of devices each of which is identical to an independent device that is described below using FIG. 2.

Figure 1P:
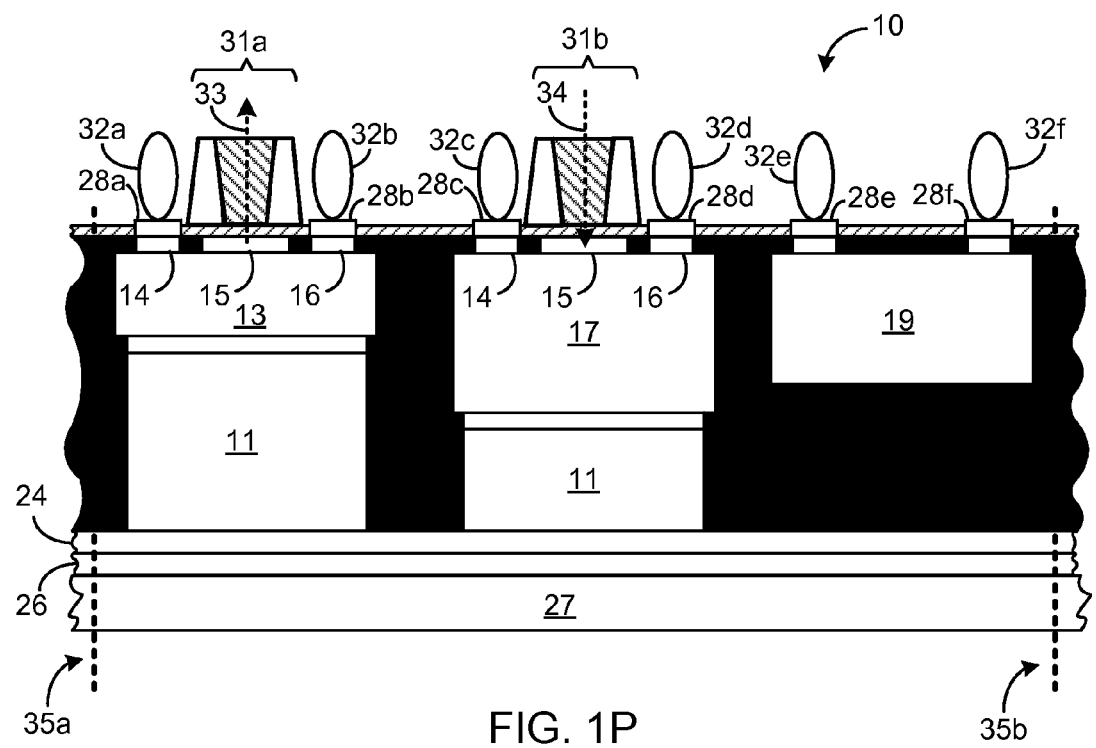
FIG. 1P shows a cross-sectional side-view of the portion of the wafer assembly after placement of electrical contact elements.
Figure 2:
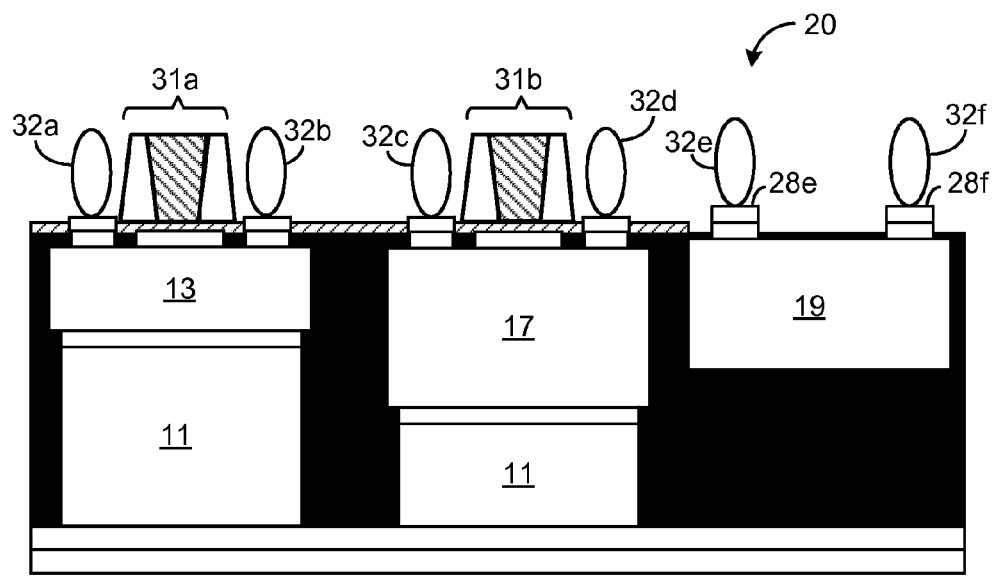
FIG. 2 shows a cross-sectional side-view of an independent device containing the set of components, after singulating the portion of the wafer assembly shown in FIG. 1P from the rest of the wafer assembly.

FIG. 2 shows a transceiver device 20 that has been produced by singulating the wafer assembly 10 along the dashed lines 35a and 35b (shown in FIG. 1P). The transceiver device 20 incorporates a combination of the optoelectronic emitter device 13, the optoelectronic receiver device 17, and the additional device 19. In other embodiments, the independent device that is batch fabricated using a wafer assembly such as the wafer assembly 10 can incorporate various other combinations other than the optoelectronic emitter device 13, the optoelectronic receiver device 17, and the additional device 19. Such other combinations can include for example, a vertical cavity surface emitting laser (VCSEL), a light emitting diode (LED), an integrated circuit (IC), and combinations thereof. When the batch fabrication is carried out using eWLP procedures, the independent device can be referred to in this disclosure as an eWLP package.

It should be understood that in the example embodiment shown in FIG. 2, the optoelectronic emitter device 13 and the optoelectronic receiver device 17 are indirectly connected to the metal layer 24 via the backside interconnection elements 11. In other embodiments, the fabrication procedure described above can be carried out without incorporating the backside interconnection elements 11, whereby one or both of the optoelectronic emitter device 13 and the optoelectronic receiver device 17 are directly connected to the metal layer 24. Adhesive tape 27 has been removed at this stage.

Figure 3:
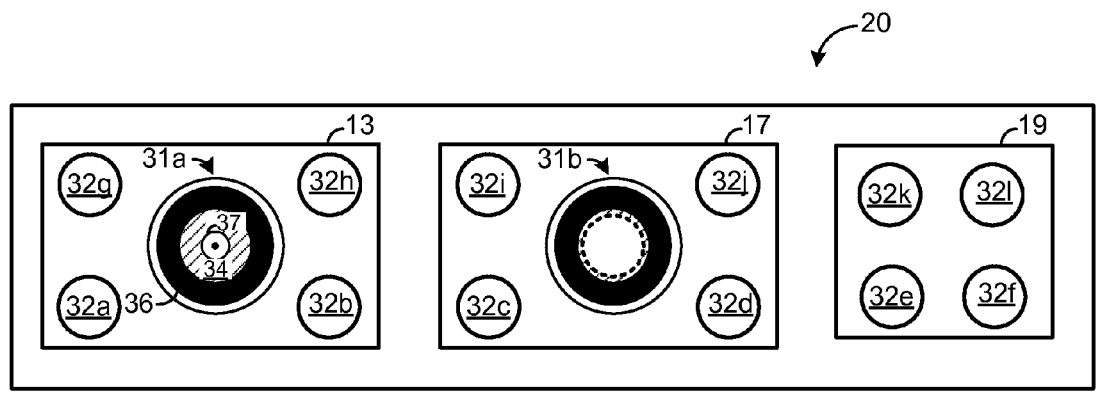
FIG. 3 shows a top view of the independent device (shown in FIG. 2) in a first example implementation.

Attention is now drawn to FIG. 3, which shows a top view of the transceiver device 20 in a first example implementation. In this first example implementation, each of the first polymer-based fiber alignment structure 31a and the second polymer-based fiber alignment structure 31b has a vertically elongated hollow structure with a circular profile. Specifically, the vertically elongated hollow structure is a mesa-shaped hollow structure. The following description that is provided with reference to the first polymer-based fiber alignment structure 31a of FIG. 3 is equally pertinent to the second polymer-based fiber alignment structure 31b of FIG. 3.

The upper end of the mesa-shaped hollow structure (indicated by the darkened region) corresponds to an exposed external surface 36 of the first polymer-based fiber alignment structure 31a. The exposed external surface 36 defines a top opening through which light can enter or exit the hollow portion of the mesa-shaped hollow structure. The bottom end 37 of the mesa-shaped hollow structure (indicated by the unshaded region) defines a bottom opening through which light can exit or enter the light propagating portion 15 of the optoelectronic emitter device 13. The dot at the center of the bottom end 37 corresponds to the first optical axis along which light is transmitted out of the light propagating portion 15 of the optoelectronic emitter device 13. The hollow portion of the mesa-shaped hollow structure is defined by the sloping internal surface 34 indicated by the hatched region. The sloping internal surface 34, which extends from the top opening to the bottom opening of the mesa-shaped hollow structure, defines the hollow portion as a tapered hollow portion of the first polymer-based fiber alignment structure 31a. The tapered hollow portion is operative as a stationary guiding structure for automatically guiding an optical fiber into optical alignment with the light propagating portion 15 of the optoelectronic emitter device 13 when the optical fiber is inserted into the first polymer-based fiber alignment structure 31a.

Figure 4:
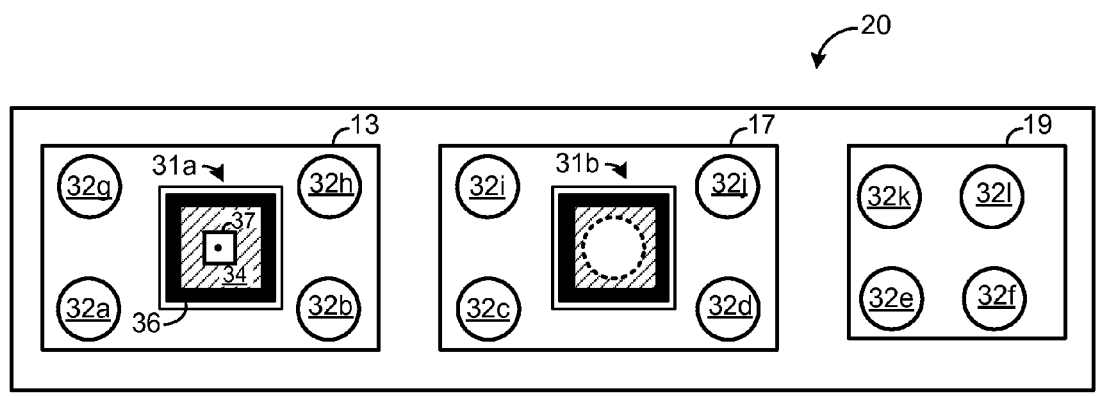
FIG. 4 shows a top view of the independent device (shown in FIG. 2) in a second example implementation.

FIG. 4 shows a top view of the transceiver device 20 in a second example implementation. In this second example implementation, each of the first polymer-based fiber alignment structure 31a and the second polymer-based fiber alignment structure 31b has a vertically elongated hollow structure with a square profile.

Figure 5:
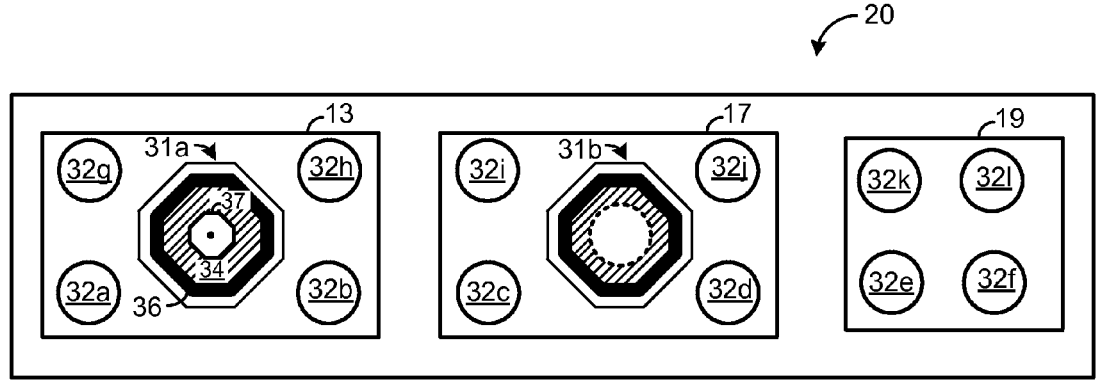
FIG. 5 shows a top view of the independent device (shown in FIG. 2) in a third example implementation.

FIG. 5 shows a top view of the transceiver device 20 in a third example implementation. In this third example implementation, each of the first polymer-based fiber alignment structure 31a and the second polymer-based fiber alignment structure 31b has a vertically elongated hollow structure with a polygon profile. The polygon in this example embodiment is an octagon.

The various parts (darkened region, unshaded region, hatched region etc.) of the second and third example embodiments shown in FIGS. 4 and 5 can be understood from the description provided above with respect to FIG. 3 and will not be repeated here in the interest of brevity. However, attention is drawn to the dashed line circle indicated inside each of the second polymer-based fiber alignment structure 31b of FIGS. 3-5. The dashed line circle provides a cross-sectional view of an optical fiber when inserted into the tapered hollow portion of the first polymer-based fiber alignment structure 31b. It should be understood that the exposed end of the optical fiber (dashed line circle) is seated upon an intermediate portion of the tapered hollow portion. This aspect as well as other aspects will be described below in more detail using other figures. It should be also understood that the dashed line circle shown in each of the second polymer-based fiber alignment structure 31b of FIGS. 3-5 has been omitted from each of the polymer-based fiber alignment structure 31a of FIGS. 3-5 solely in the interest of providing clarity to the figures.

Figure 6:
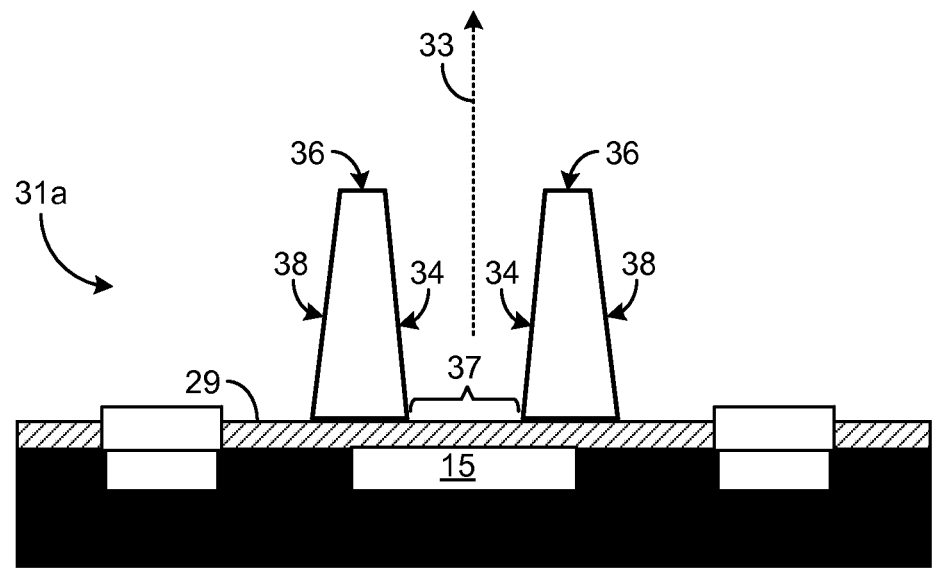
FIG. 6 shows a polymer-based fiber alignment structure in accordance with the disclosure, for purposes of describing various surface related features.

FIG. 6 shows the first polymer-based fiber alignment structure 31a for purposes of describing various surface related features. The following description may be better understood in view of the identical numerals that are used in FIG. 6 and each of FIGS. 3-5, such as the exposed external surface 36, the light propagating surface 37, and the sloping internal surface 34. Some additional aspects of the first polymer-based fiber alignment structure 31a will now be described with reference to FIG. 6.

The sloping internal surface 34 slopes inwards from the top opening defined by the exposed external surface 36 and characterizes the tapered hollow portion 39 of the first polymer-based fiber alignment structure 31a. The dimensions and orientation of the sloping internal surface 34 can be configured such that a cross-sectional area (circular, square, or polygonal profile) of an intermediate portion of the tapered hollow portion 39 provides a fit to a diameter of an optical fiber that can be inserted into the tapered hollow portion 39.

In the example embodiment shown in FIG. 6, an external surface 38 is sloping in an outwards direction from the exposed external surface 36. However, in another embodiment, the external surface 38 can be perpendicular to the dielectric layer 29, and the first polymer-based fiber alignment structure 31a can thus be described as an upright cylindrical structure having a hollow interior that is defined by a sloping internal surface.

In yet another embodiment, the external surface 38 can slope in an inwards direction from the exposed external surface 36, say for example, parallel to the sloping internal surface 34. As a result, the first polymer-based fiber alignment structure 31a can be described as an inverted mesa structure having a hollow interior that is defined by a sloping internal surface.

Figure 7:
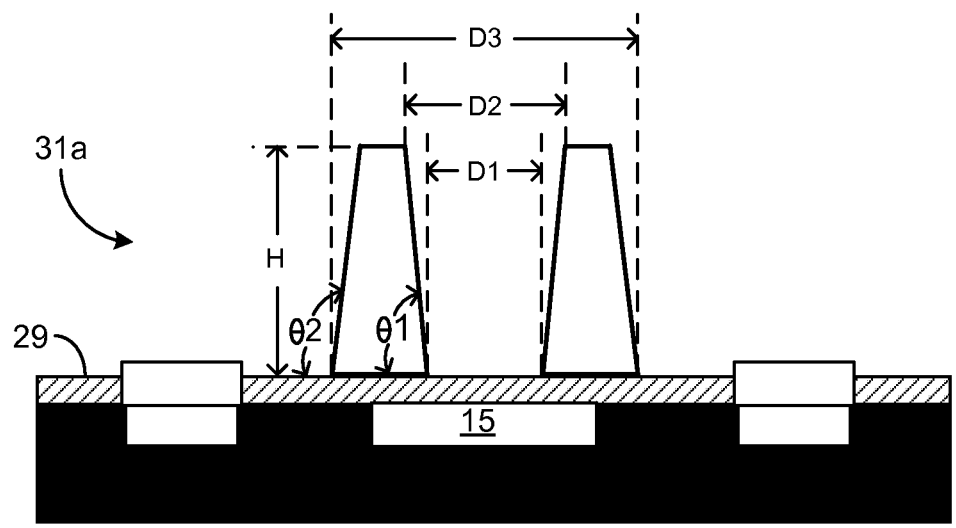
FIG. 7 shows the first polymer-based fiber alignment structure of FIG. 6 for purposes of describing various dimensions and orientation parameters.

FIG. 7 shows the first polymer-based fiber alignment structure 31a for purposes of describing various dimensions and orientation parameters. In one exemplary embodiment, the dimension "D1" (corresponding to the bottom opening) can range from about 0.10 mm to about 3.00 mm, dimension "D2" (corresponding to the top opening) can range from about 0.10 mm to about 3.20 mm, and dimension "D3" (corresponding to the outer-most dimensions of the first polymer-based fiber alignment structure 31a) can range from about 3.30 mm to about 4.50 mm. Specifically, when the first polymer-based fiber alignment structure 31a is a vertically elongated hollow structure with a circular profile (as shown in FIG. 3), each of the dimensions D1, D2 and D3 correspond to a diameter of a circle. When the first polymer-based fiber alignment structure 31a is a vertically elongated hollow structure with a square profile (as shown in FIG. 4), each of the dimensions D1, D2 and D3 can correspond to a length of a side of a square. When the first polymer-based fiber alignment structure 31a is a vertically elongated hollow structure with a polygon profile (as shown in FIG. 5), each of the dimensions D1, D2 and D3 can be based on a length of two or more sides of a polygon. Furthermore, the dimension "H" can range from about 0.2 mm to about 2.00 mm and represents a height of the polymer-based fiber alignment structure 31a with respect to a top surface of the wafer assembly 10. The orientation of the sloping internal surface 34 can be defined in a variety of ways. For example, a slope angle of the sloping internal surface 34 can be defined on the basis of an angle "θ1" and/or on the basis of a difference between the "D2" dimension and the D1" dimension. The slope angle of the external surface 38 can be defined on the basis of an angle "θ2," which is equal to 90 degrees when the first polymer-based fiber alignment structure 31a is an upright cylindrical structure and greater than 90 degrees when the first polymer-based fiber alignment structure 31a is a mesa-shaped hollow structure.

Figure 8:
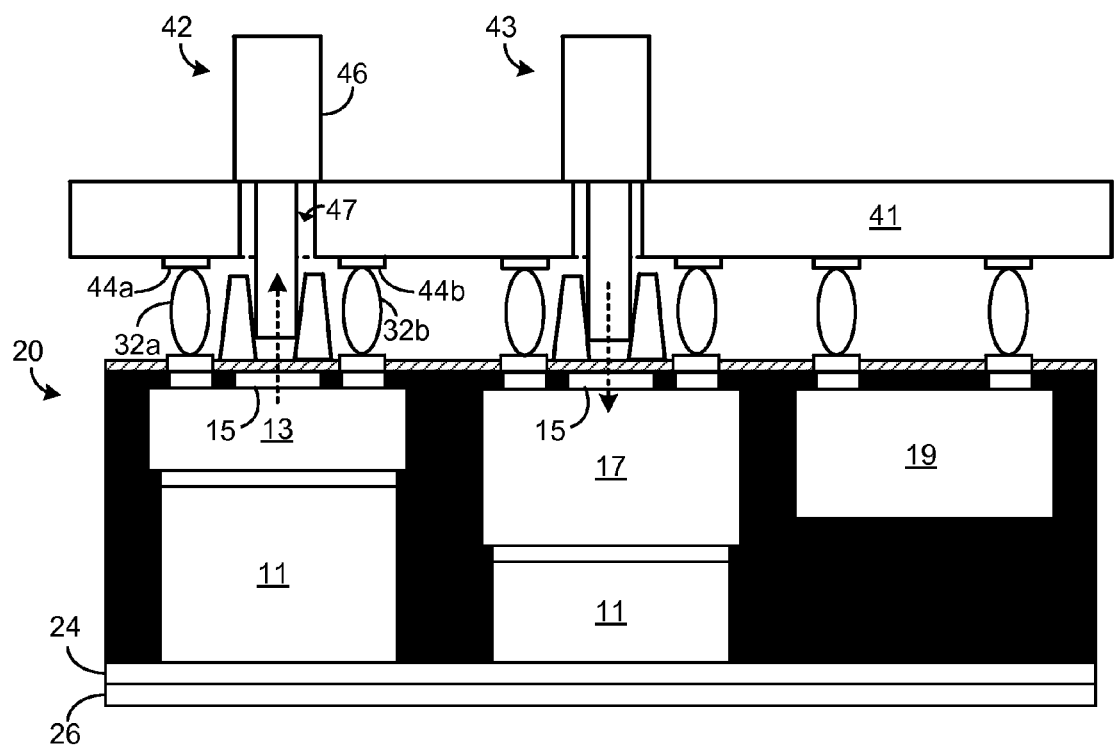
FIG. 8 shows an optoelectronic assembly that includes additional elements coupled to the independent device shown in FIG. 2.

Attention is now drawn to FIG. 8, which shows additional elements coupled to the independent device 20 shown in FIG. 2. Specifically, a board 41 having one or more through holes is attached to the independent device 20. The attachment can be carried out in various ways, such as for example, by using mechanical fasteners or by using soldering techniques. In one example implementation, the board 41 is a printed circuit board (PCB) having solder pads, such as solder pads 44a and 44b that are used for soldering to the raised portions of metal 28a and 28b of the independent device 20. The soldering is carried out by using electrically-conductive contact elements 32a and 32b. Other solders pads of the board 41 are similarly soldered to corresponding raised portions of metal 28a and 28b of the independent device 20.

The following description is directed to the optical fiber 42 and the optoelectronic emitter device 13. However, it will be understood that the description applies to the optical fiber 43 and the optoelectronic receiver device 17 as well.

The board 41 includes a first through hole that is operative as a pre-alignment hole 47 into which an optical fiber 46 is inserted. In this example embodiment, a jacket portion 46 of the optical fiber 46 abuts a major surface of the board 41 and a core portion of the optical fiber 46 passes through the pre-alignment hole 47 and into the tapered hollow portion 39 of the first polymer-based fiber alignment structure 31a. (Certain numerals that are shown in other figures are not shown in FIG. 8 in the interest of clarity).

The sloping internal surface 34 of the first polymer-based fiber alignment structure 31a guides the optical fiber 46 in such a manner that the exposed end of the core portion of the optical fiber 46 becomes automatically aligned with the first optical axis associated with the light propagating portion 15 of the optoelectronic emitter device 13. As can be seen, the exposed end of the core portion of the optical fiber 46 fits snugly into an intermediate portion of the tapered hollow portion 39.

In one example implementation, the first polymer-based fiber alignment structure 31a is dimensioned to accommodate any one of a number of optical fibers. The location of the intermediate portion (on the sloping internal surface 34) will accordingly vary depending upon the diameter of each of the optical fibers. Thus, when a first optical fiber having a first diameter is inserted into the tapered hollow portion 39, the exposed end of the first optical fiber is located closer to the light propagating portion 15 of the optoelectronic emitter device 13 than when a second optical fiber having a diameter that is larger than the diameter of the first optical fiber is inserted into the tapered hollow portion 39 in place of the first optical fiber. In this example implementation, the "D1" and "D2" dimensions shown in FIG. 7 can be selected on the basis of a range of diameters of a set of optical fibers. Specifically, the "D1" dimension is selected to be smaller than a diameter of the smallest-diameter optical fiber in the set of optical fibers, and the "D2" dimension is selected to be larger than a diameter of the largest-diameter optical fiber in the set of optical fibers.

A few examples of the various types of optical fibers (pictorially represented by the optical fiber 42 and the optical fiber 43) can include various single mode and multimode optical fibers, such as for example, a plastic optical fiber (POF), a plastic-clad silica fiber (PCS fiber), and a multi-mode fiber (MMF fiber).

In other example implementations, the tapered hollow portion 39 of the first polymer-based fiber alignment structure 31a and/or the tapered hollow portion 39 of the second polymer-based fiber alignment structure 31b can be used as a container for holding a variety of materials, including various fluids and compounds. For example, in one implementation, an index matching gel (not shown) is provided in the tapered hollow portion 39 of the first polymer-based fiber alignment structure 31a. The index matching gel enhances the optical coupling factor between the optical fiber 43 and the optoelectronic emitter device 13.

The arrangement shown in FIG. 8 obviates the need to execute intricate and complicated traditional procedures that are typically used for coupling and aligning an optical fiber with a light propagating portion of an optoelectronic device, especially when the optoelectronic device is located inside an eWLP package.

Figure 9A:
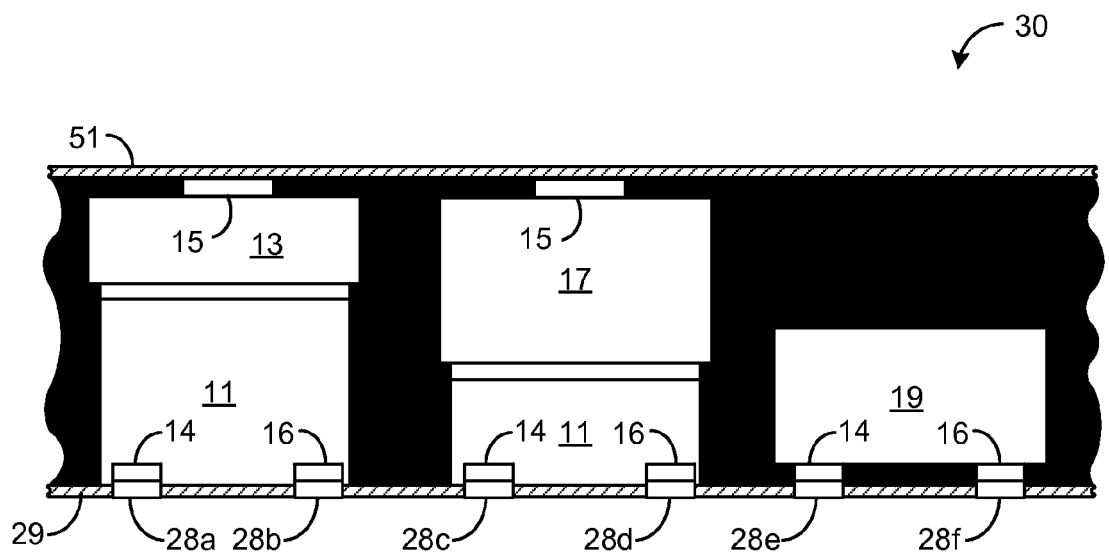
FIG. 9A shows a cross-sectional side-view of a portion of a wafer assembly during an intermediate step of an example fabrication procedure in accordance with a second example embodiment of the invention.

Attention is now drawn to FIG. 9A, which shows a cross-sectional side-view of a wafer assembly 30 during an intermediate step of an example fabrication procedure in accordance with a second example embodiment of the invention. The fabrication steps performed prior to obtaining the wafer assembly 30 shown in FIG. 9A can be understood in view of the fabrication procedures described above with respect to the wafer assembly 10 using FIG. 1A through FIG. 1H. The fabrication steps indicated in FIG. 1A through FIG. 1H with respect to the wafer assembly 10 are similar to those that can be carried out for obtaining the wafer assembly 30 shown in FIG. 9A. These steps that can be executed (with suitable modifications were applicable) for fabricating the wafer assembly 30 will not be repeated here in the interest of brevity. However, attention is drawn once again to the wafer assembly 10 shown in FIG. 1I in order to describe certain similarities and certain differences with respect to the wafer assembly 30 shown in FIG. 9A.

Similar to the wafer assembly 10 shown in FIG. 1I, the wafer assembly 30 shown in FIG. 9A includes an optoelectronic emitter device 13, an optoelectronic receiver device 17, and an additional device 19. However, there are several differences between the wafer assembly 30 shown in FIG. 9A and the wafer assembly 10 shown in FIG. 1I. Specifically, the type of layers on opposing surfaces of the wafer assembly 30 shown in FIG. 9A and the wafer assembly 10 shown in FIG. 1I are different, and the arrangement of the electrical contacts 14 and 16 with respect to the light propagating portion 15 in each of the optoelectronic emitter device 13 and the optoelectronic receiver device 17 is different as well. These aspects will be described below in more detail.

Firstly, the dielectric layer 29, the electrical contacts 14 and 16, and the raised portion of metal 28a-f shown in FIG. 9A are fabricated in a manner similar to that described above with respect to FIGS. 1J-1L. However, in contrast to the location of these items on an upper major surface of the wafer assembly 10 shown in FIGS. 1J-1L, the dielectric layer 29, the electrical contacts 14 and 16, and the raised portion of metal 28a-f that are shown in FIG. 9A are located on a bottom major surface of the wafer assembly 30.

The light propagating portion 15 in each of the optoelectronic emitter device 13 and the optoelectronic receiver device 17 shown in FIG. 9A is located on a top major surface of the wafer assembly 30. Furthermore, a dielectric layer 51 is provided on top of the light propagating portions 15 that are located on the top major surface of the wafer assembly 30.

Figure 9B:
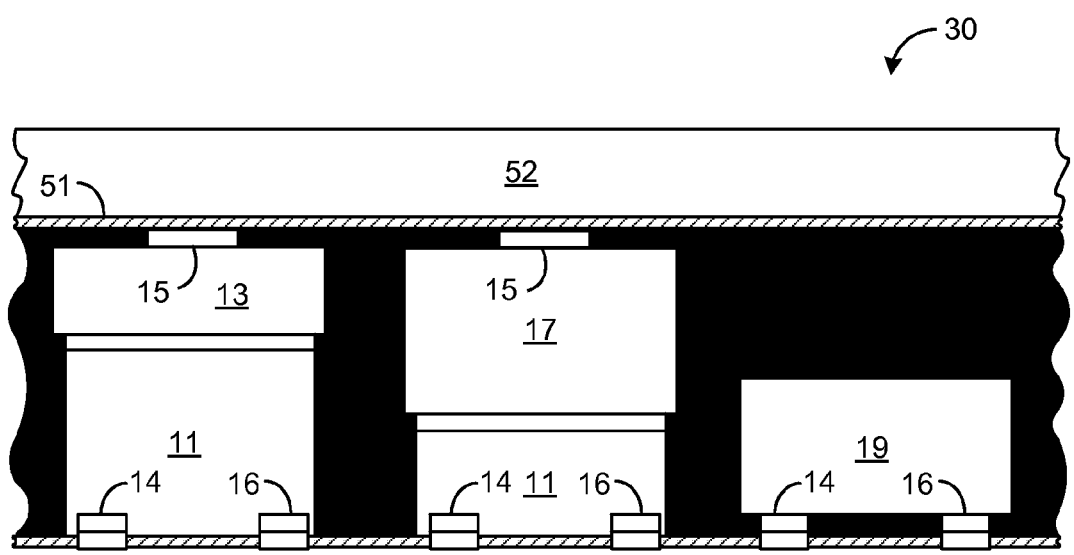
FIG. 9B shows a cross-sectional side-view of the portion of the wafer assembly of FIG. 9A after depositing of a polymer layer on top of the dielectric layer.

FIG. 9B shows a cross-sectional side-view of the wafer assembly 30 after depositing of a polymer layer 52 on top of the dielectric layer 51. One among various types of polymers that can be used for polymer layer 52 is an SU-8 polymer, which is a negative, epoxy-type, near-UV photoresist based on an EPON SU-8 epoxy resin. The thickness of the polymer layer 52 can be varied in accordance with various factors, such as, for example, the nature of the fabrication process, the size of the devices (the optoelectronic emitter device 13, the optoelectronic receiver device 17, and the additional device 19), the height of the assembly 30, and the dimensions of various optical fibers (not shown). However, a lower thickness threshold of about 200 microns can be used to ensure a minimum acceptable dimension of the polymer layer 52. In one example embodiment, an SU-8 polymer layer 52 is provided with a thickness of about 1 mm when the overall height of the assembly 30 is around 0.8 mm.

Figure 9C:
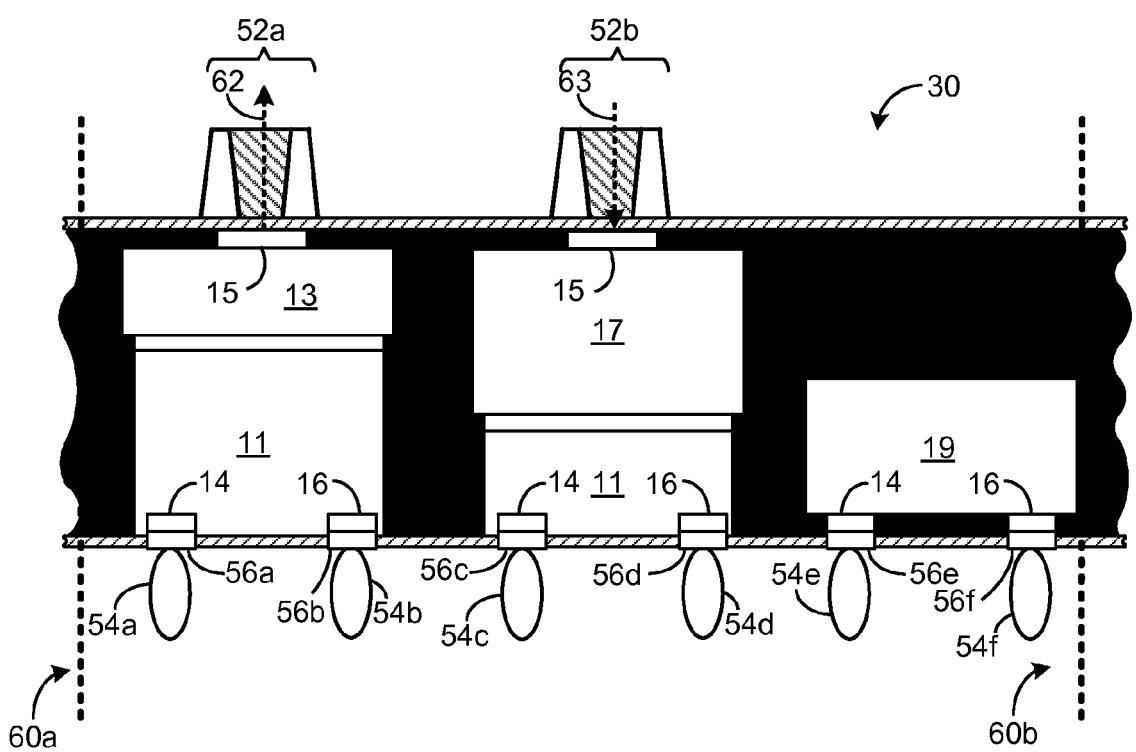
FIG. 9C shows a cross-sectional side-view of the portion of the wafer assembly after removal of portions of the polymer layer to form one or more polymer-based fiber alignment structures in accordance with a second example embodiment.

FIG. 9C shows a cross-sectional side-view of the wafer assembly 30 after removal of portions of the polymer layer 52 shown in FIG. 9B. The remaining portions in this example embodiment include a first polymer-based fiber alignment structure 52a that is located over the light propagating portion 15 of the optoelectronic emitter device 13 and a second polymer-based fiber alignment structure 52b that is located over the light propagating portion 15 of the optoelectronic receiver device 17. Dashed arrow 62 indicates a first optical axis for light that is transmitted out of the light propagating portion 15 of the optoelectronic emitter device 13. Dashed arrow 63 indicates a second optical axis for light that is transmitted by an optical fiber (not shown) into the light propagating portion 15 of the optoelectronic receiver device 17.

Some additional details about the first polymer-based fiber alignment structure 52a and the second polymer-based fiber alignment structure 52b can be understood from the description provided above with respect to FIGS. 3-7, which is equally pertinent to the first polymer-based fiber alignment structure 52a and the second polymer-based fiber alignment structure 52b.

Electrical contacts 54a and 54b are placed upon the raised portion of metal 56a located on the first electrical contact 14 and upon the raised portion of metal 56b located on the second electrical contact 16 of the optoelectronic emitter device 13. Electrical contacts 54c and 54d are placed upon the raised portion of metal 56c located on the first electrical contact 14 and upon the raised portion of metal 56d located on the second electrical contact 16 of the optoelectronic receiver device 17. Electrical contacts 54e and 54f are placed upon the raised portion of metal 56e located on the first electrical contact 14 and upon the raised portion of metal 56f located on the additional device 19. Electrical contacts 54a-f can be used for coupling other elements to the optoelectronic emitter device 13, the optoelectronic emitter device 17, and/or the additional device 19.

Figure 9D:
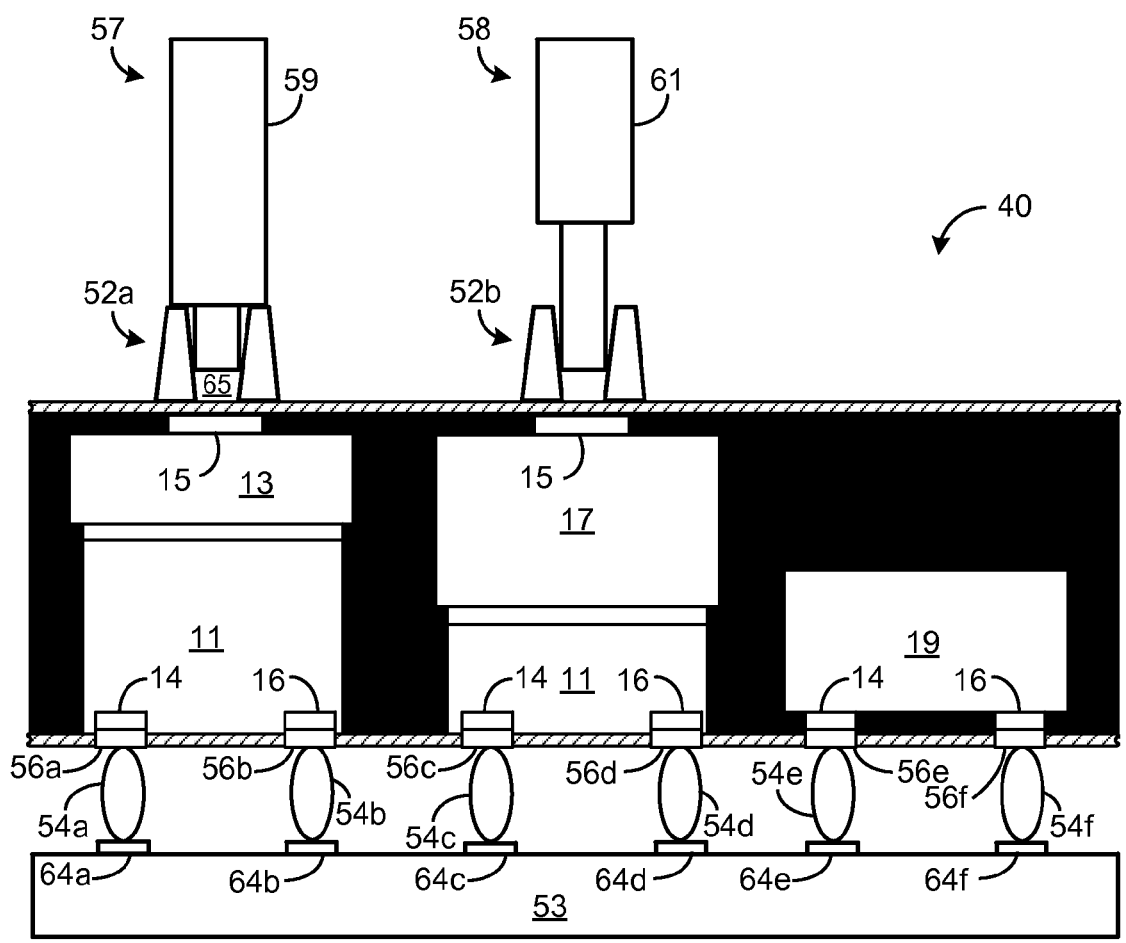
FIG. 9D shows a cross-sectional side-view of an independent device after singulating the portion of the wafer assembly shown in FIG. 9C from the rest of the wafer assembly.

The wafer assembly 30 can be viewed as constituting a single "artificial wafer" on which a number of semiconductor dies or chips are co-formed and then transformed into individual devices by dicing or singulating the wafer, as described above using FIGS. 1A-1P. One such individual device is shown in FIG. 9D in the form of a transceiver device 40 that has been produced by singulating the wafer assembly 30 along the dashed lines 60a and 60b (shown in FIG. 9C). The transceiver device 40 incorporates a combination of the optoelectronic emitter device 13, the optoelectronic receiver device 17, and the additional device 19.

Furthermore, in the example implementation shown in FIG. 9D, a board 53 is coupled to the transceiver device 40. The board 53 is a printed circuit board (PCB) having solder pads, such as solder pads 64a-f that are used for soldering to the raised portions of metal 56a-f of the transceiver device 40. The soldering is carried out by using electrically-conductive contact elements 54a-f.

Also shown in FIG. 9D is an optical fiber 57 inserted into the first polymer-based fiber alignment structure 52a. Though the following description is directed to the optical fiber 57 and the optoelectronic emitter device 13, it will be understood that the description applies to the optical fiber 58 and the optoelectronic receiver device 17 as well. Unlike in the first example embodiment shown in FIG. 8, in this example implementation, the board 53 is not used for providing pre-alignment of the optical fiber 57. Instead, the optical fiber 57 is inserted directly into the first polymer-based fiber alignment structure 52a. If needed, the optical fiber 57 can be supported using support mechanisms (not shown) such as a mechanical fixture or an adhesive.

Furthermore, in this example implementation, a jacket portion 59 of the optical fiber 57 abuts a top external surface of the first polymer-based fiber alignment structure 52a. Alternatively, the optical fiber 57 can be arranged in the manner indicated by the optical fiber 58 where the jacket portion 61 is not abutting a top external surface of the second polymer-based fiber alignment structure 52b.

The sloping internal surface of the first polymer-based fiber alignment structure 52a automatically guides the optical fiber 57 in such a manner that the exposed end of the core portion of the optical fiber 57 becomes automatically aligned with the first optical axis associated with the light propagating portion 15 of the optoelectronic emitter device 13. As can be seen, the exposed end of the core portion of the optical fiber 46 fits snugly into an intermediate portion of the tapered hollow portion 65 that is dimensioned for this purpose.

A few example of the various types of optical fibers that are represented by the optical fiber 57 and the optical fiber 58 can include various single mode and multimode optical fibers, such as for example, a plastic optical fiber (POF), a plastic-clad silica fiber (PCS fiber), and a multi-mode fiber (MMF fiber).

In other example implementations, the tapered hollow portion of the first polymer-based fiber alignment structure 52a and/or the tapered hollow portion of the second polymer-based fiber alignment structure 52b can be used as a container for holding a variety of materials, including various fluids and compounds. For example, in one implementation, an index matching gel (not shown) is provided in the tapered hollow portion of the first polymer-based fiber alignment structure 52a. The index matching gel enhances the optical coupling factor between the optical fiber 57 and the optoelectronic emitter device 13.

Figure 10:
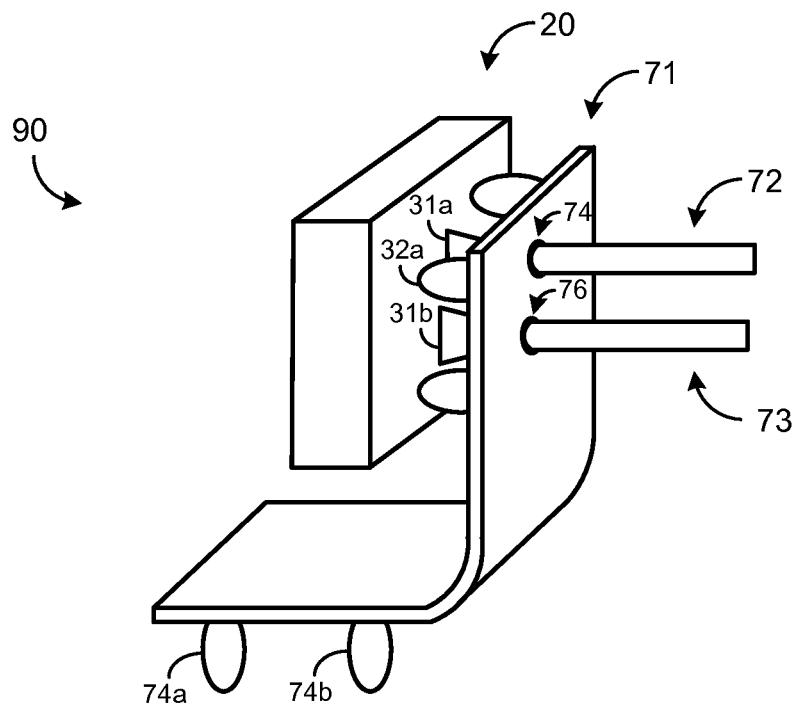
FIG. 10 shows an assembly that includes an optoelectronic device mounted on a board in a first exemplary configuration in accordance with the disclosure.

FIG. 10 shows an assembly 90 that includes an optoelectronic device mounted on a board in a first exemplary configuration. In this example implementation, the optoelectronic device is the transceiver device 20 (shown in FIG. 2) and the board is a flexible circuit board 71. A first optical fiber 72 is coupled to the optoelectronic emitter device inside the transceiver device 20 via a pre-alignment hole 74 located in the flexible circuit board 71 and the first polymer-based fiber alignment structure 31a that is located on the transceiver device 20 as described above.

Similarly, a second optical fiber 73 is coupled to the optoelectronic receiver device inside the transceiver device 20 via another pre-alignment hole 76 located in the flexible circuit board 71 and the second polymer-based fiber alignment structure 31b that is located on the transceiver device 20 as described above.

The flexible circuit board 71 is flexed in order to assume an L-shaped configuration. The upright portion of the L-shaped configuration can be retained in the upright portion using various support mechanisms (not shown) and/or by support mechanisms that anchor one or both of the optical fiber 72 and the optical fiber 73. Each of the first optical fiber 72 and the second optical fiber 73 is inserted into the pre-alignment hole 74 and the pre-alignment hole 76 respectively from an outward-facing surface of the upright portion of the flexible circuit board 71. An opposing inward-facing surface of the upright portion of the flexible circuit board 71 includes solder pads (not shown) that are used for soldering the electrical contacts (such as electrical contact 32a) that are a part of the transceiver device 20.

The horizontal portion of the flexible circuit board 71 includes solder pads (not shown) that are soldered to electrical contacts 74a and 74b. The electrical contacts 74a and 74b can be used to attach the assembly 90 to other elements, such as a rigid printed circuit board or another flexible circuit board. Thus, the assembly 90 can be incorporated into various enclosures, modules, and/or fixtures where space is limited and wherein the flexible characteristics and small size of the assembly 90 proves beneficial. As can be understood, the small size of the assembly 90 is a result of the eWLP packaging and the comparably sized polymer-based fiber alignment structures attached thereto.

The pre-alignment hole 74 and the pre-alignment hole 76 on the flexible circuit board 71 eliminate the need for using ferrules and other such hardware. In example implementations, the diameter of each of the pre-alignment hole 74 and the pre-alignment hole 76 can range from about 150 microns to about 3 mm. Unlike conventional fixtures wherein various dimensions (such as a diameter of a ferrule or a connector) has to be customized for each specific type of optical fiber, the diameter of each of the pre-alignment hole 74 and the pre-alignment hole 76 can be easily modified to accommodate various types of optical fibers having various diameters. Furthermore, the tapered hollow portion of each of the first polymer-based fiber alignment structure 31a and the second polymer-based fiber alignment structure 31b also accommodate various types of optical fibers having various diameters (as described above). Thus the combination of the pre-alignment action provided by the circuit board 71 and the precise alignment action provided by the tapered hollow portion of each of the first polymer-based fiber alignment structures 31a and 31b is operative to permit quick and precise coupling of various optical fibers to the light propagating portions of optoelectronic devices.

Figure 11:
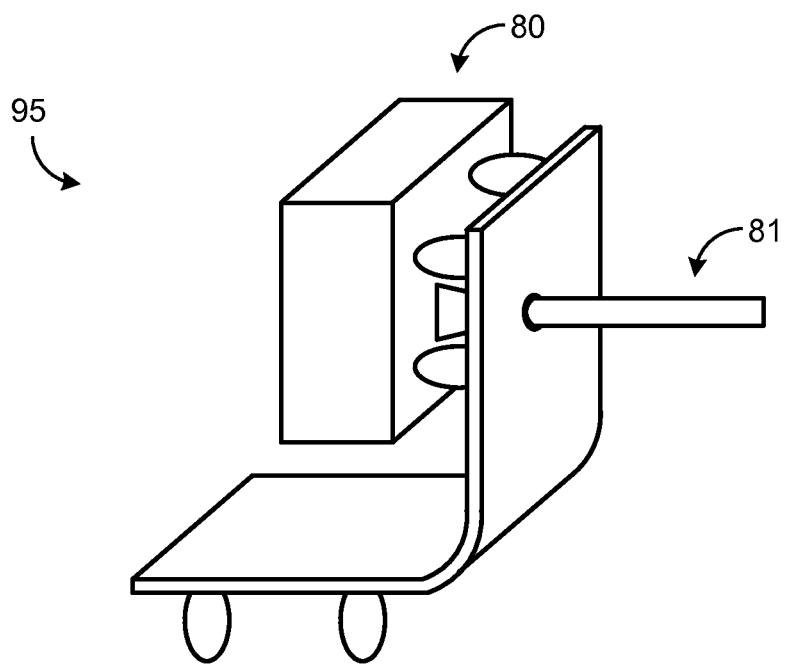
FIG. 11 shows an assembly that includes an optoelectronic device mounted on a board in a second exemplary configuration in accordance with the disclosure.

FIG. 11 shows an assembly 95 that includes a single optoelectronic device 80 mounted on a board in a second exemplary configuration. In this example implementation, the optoelectronic device 80 is one of an optoelectronic transmitter device or an optoelectronic receiver device and the board is a flexible circuit board similar to the flexible circuit board 71 described above. A single optical fiber 81 is coupled to the optoelectronic device 80 via a single pre-alignment hole located in the flexible circuit board.

It should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. For example, the invention has been described with respect to examples of particular eWLP devices and polymer-based fiber alignment structures made using methods of the invention, but the invention is not limited with respect to these particular configurations and methods. The invention is also not limited to the particular sequences of process steps described above with reference to the figures. Persons of skill in the art will understand that many variations can be made to the illustrative embodiments without deviating from the scope of the invention.

What is claimed is:

1. An assembly comprising:
   an optoelectronic device comprising a light propagating portion;
   a board having a pre-alignment hole extending through the board from a top major surface to a bottom major surface, the board arranged with respect to the optoelectronic device such that the pre-alignment hole is substantially aligned with the light propagating portion of the optoelectronic device; and
   a polymer-based fiber alignment structure located between the board and the optoelectronic device, the polymer-based fiber alignment structure comprising a tapered portion that is operative as a stationary guiding structure for automatically guiding an optical fiber into optical alignment with the light propagating portion of the optoelectronic device when the optical fiber is inserted via the pre-alignment hole of the board into the tapered portion of the polymer-based fiber alignment structure.

2. The assembly of claim 1, wherein the optoelectronic device is encapsulated within a hard molded compound in an eWLP package, the eWLP package diced from an eWLP artificial wafer.

3. The assembly of claim 2, wherein the optoelectronic device is at least one of a light emitting device or an optical detector; the board is one of a flex circuit board or a rigid circuit board; and the polymer-based fiber alignment structure is a mesa-shaped hollow structure comprising SU-8 polymer.

4. The assembly of claim 3, wherein a base portion of the mesa-shaped hollow structure encircles the light propagating portion of the optoelectronic device and wherein an interior portion of the mesa-shaped hollow structure comprises the tapered portion.

5. The assembly of claim 4, wherein one of an end section or an intermediate section of the tapered portion has a cross-sectional area corresponding to an external diameter of the optical fiber.

6. The assembly of claim 4, wherein the external diameter corresponds to an unjacketed portion of the optical fiber.

7. The assembly of claim 2, wherein the polymer-based fiber alignment structure is a vertically elongated hollow structure comprising SU-8 polymer, and wherein an interior portion of the vertically elongated hollow structure comprises the tapered portion.

8. The assembly of claim 2, wherein the polymer-based fiber alignment structure is located inside the eWLP package on at least one of a dielectric layer or a metal layer located on a top surface of the optoelectronic device.

9. An assembly comprising:
   an eWLP package comprising an optoelectronic device encapsulated within a hard molded compound, the optoelectronic device comprising a light propagating portion, wherein the optoelectronic device is at least one of a light emitting device or an optical detector;
   an SU-8 polymer-based fiber alignment structure attached to the optoelectronic device, the SU-8 polymer-based fiber alignment structure having one of a mesa-shape or a vertically elongated shape and comprising a hollowed central portion having sloping sides, the sloping sides operative as a stationary guiding structure for automatically guiding an optical fiber into optical alignment with the light propagating portion of the optoelectronic device when the optical fiber is inserted into the SU-8 polymer-based fiber alignment structure, and wherein an intermediate section of the hollowed central portion has a first diameter corresponding to an external diameter of an unjacketed portion of the optical fiber and an end section adjoining the eWLP package has a second diameter that is smaller than the first diameter; and
   a board having a through hole extending through the board from a top major surface to a bottom major surface, the board arranged with respect to the optoelectronic device such that the through hole provides pre-alignment of the optical fiber when the optical fiber is inserted via the through hole of the board into the tapered portion of the SU-8 polymer-based fiber alignment structure the sloping sides of the hollowed central portion providing the stationary guiding structure for precision alignment of the optical fiber with the light propagating portion of the optoelectronic device.

10. The assembly of claim 9, wherein the board is one a flex circuit board or a printed circuit board.

* * * * *